United States Patent
Hayashida et al.

[11] Patent Number: 6,060,768
[45] Date of Patent: *May 9, 2000

[54] SEMICONDUCTOR DEVICE, METHOD OF MANUFACTURING THE SEMICONDUCTOR DEVICE, AND METHOD OF MANUFACTURING LEAD FRAME

[75] Inventors: Katsuhiro Hayashida; Mitsutaka Sato; Tadashi Uno; Tetsuya Fujisawa, all of Kawasaki; Masaki Waki, Kagoshima, all of Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/935,892

[22] Filed: Sep. 23, 1997

Related U.S. Application Data

[63] Continuation of application No. 08/568,864, Dec. 5, 1995, abandoned.

[30] Foreign Application Priority Data

May 9, 1995 [JP] Japan ................................. 7-110380

[51] Int. Cl.[7] ............................. H01L 23/48; H01L 29/46
[52] U.S. Cl. ......................... 257/666; 257/673; 257/735; 257/690
[58] Field of Search ................................... 257/673, 676, 257/690, 735, 736, 666, 686

[56] References Cited

U.S. PATENT DOCUMENTS

| | | | |
|---|---|---|---|
| 5,157,480 | 10/1992 | McShane et al. | 357/74 |
| 5,172,214 | 12/1992 | Casto | 257/676 |
| 5,291,059 | 3/1994 | Ishitsuka et al. | 257/666 |
| 5,302,849 | 4/1994 | Cavasin | 257/666 |
| 5,309,021 | 5/1994 | Shimamoto et al. | 257/691 |
| 5,319,242 | 6/1994 | Carney et al. | 257/680 |
| 5,436,500 | 7/1995 | Park et al. | 257/696 |
| 5,455,200 | 10/1995 | Bigler et al. | 437/220 |
| 5,457,340 | 10/1995 | Templeton, Jr. et al. | 257/666 |
| 5,466,966 | 11/1995 | Ito | 257/666 |
| 5,477,079 | 12/1995 | Hiruta | 257/665 |
| 5,508,556 | 4/1996 | Lin | 257/691 |
| 5,554,886 | 9/1996 | Song | 257/666 |
| 5,677,566 | 10/1997 | King et al. | 257/666 |

*Primary Examiner*—Donald L. Monin, Jr.
*Attorney, Agent, or Firm*—Armstrong, Westerman, Hattori, McLeland & Naughton

[57] ABSTRACT

A semiconductor device includes a semiconductor chip in which electrode pads are formed with a first pitch, leads electrically connected with the electrode pads through lines, and sealing plastic sealing the semiconductor chip. In the semiconductor device, projections used for external connection ports are formed in the leads with a second pitch. The sealing plastic seals the lines connecting the electrode pads and the leads, but the projections are exposed from the sealing plastic.

12 Claims, 21 Drawing Sheets

12 BASIC MEMBER

11 LEAD FRAME

SEMICONDUCTOR DEVICE, METHOD OF MANUFACTURING THE SEMICONDUCTOR DEVICE, AND METHOD OF MANUFACTURING LEAD FRAME

This application is a continuation of application Ser. No. 08/568,864 filed Dec. 5, 1995, now abandoned.

BACKGROUND OF THE INVENTION

1. Field of the Invention

The present invention generally relates to a semiconductor device, a method of manufacturing the semiconductor device, and a method of manufacturing a lead frame, and more particularly, to a semiconductor device and its manufacturing method in which a semiconductor device and leads are sealed with plastic, and a method of manufacturing a lead frame which is used in the semiconductor device.

Recently, as an electronic apparatus containing semiconductor devices is miniaturized, integration and high-density fabrication of the semiconductor devices are performed.

On the other hand, reliability of both the electronic apparatus and the semiconductor devices needs to be improved. Furthermore, semiconductor devices capable of reducing a product cost are also desired.

2. Description of the Related Art

Recently, as a method of fabricating semiconductor devices at high density, a fabrication structure of a flip-chip method is well-known, and is widely used in a multi-chip module (MCM). In the flip-chip-type fabrication used in the MCM, after bumps are formed on electrode pads of an unsealed semiconductor chip (a bare chip), the bare chip is bonded face down to electrode parts of a mother board.

When the fabrication structure of the flip-chip method is used, the semiconductor devices may be arranged on the mother board at high density. Since the semiconductor device is electrically connected to the mother board by using the bumps directly formed on the bare chip, electrical characteristics may be improved.

However, there is a problem in that an unsealed bare chip has disadvantages in heat resistance, mechanical strength, and wet proofing.

Further, since the bumps are directly formed on the electrode pads formed in the bare chip to form external connection ports, a layout of the electrode pads formed in the bare chip becomes directly a layout of the external connection ports (bumps).

Typically, the layout of the electrode pads of the semiconductor device chip is different for each semiconductor-device manufacturing company. Therefore, even if the semiconductor devices have the same function, a user needs to design line patterns of the mother board adaptable to a variety of semiconductor devices (a variety of manufacturing companies). In this way, in a conventional fabrication structure using the bare chip, since the layout of the external connection ports of the semiconductor device is not standardized, the semiconductor device may not be matched to the mother board. There is thus a problem that a work load for the user increases.

To resolve the above problem, it is considered that standardization is carried out by arranging a large number of lines on a surface of the chip. However, in this configuration, many high-precision processes are required for arranging the large number of lines. The many high-precision processes increase a product cost and degrade a manufacturing efficiency.

SUMMARY OF THE INVENTION

It is an object of the present invention to provide a semiconductor device, a method of manufacturing the semiconductor device, and a method of manufacturing a lead frame. External connection ports of the semiconductor device may be standardized while maintaining reliability of a semiconductor chip. Also, a product cost of the semiconductor device can be reduced. Further, a manufacturing efficiency of the semiconductor device can be improved. This permits the disadvantages described above to be eliminated.

The object described above is achieved by a semiconductor device comprising: a semiconductor chip in which electrode pads are formed with a first pitch; leads electrically connected with the electrode pads through lines; and sealing plastic sealing the semiconductor chip; wherein projections used for external connection ports are formed in the leads with a second pitch; the sealing plastic seals the lines connecting the electrode pads and the leads; and the projections are exposed from the sealing plastic.

The object described above is also achieved by a semiconductor device comprising: a semiconductor chip 2 in which electrode pads are formed with a first pitch; leads electrically connected with the electrode pads through lines; and sealing plastic sealing the semiconductor chip; wherein projections used for external connection ports are formed in the leads with a second pitch; and a thickness of the sealing plastic from a face of the electrode pads is equal to or smaller than a height of the projections from the face of the electrode pads, and is equal to or larger than a height from the face of the electrode pads to the lines.

According to the above semiconductor devices, since the semiconductor chip is sealed with the sealing plastic, heat-resistant performance, mechanical-strength performance, and wet-proof performance may be improved. Further, since the electrode pads are leaded by using the leads and the lines, a layout of the leads may be selected regardless of a layout of the electrode pads. Therefore, matching performance to a fabrication board may be improved. Since the sealing plastic positively protects the leaded lines, reliability may be improved. Further, since the external connection ports are exposed from the sealing plastic, the electrical connection between the semiconductor device and the fabrication board may positively be performed.

The object described above is also achieved by the semiconductor device mentioned above, wherein the semiconductor device further comprises a polyimide film operable as an adhesive under a given condition, and the semiconductor chip and the leads are joined by the polyimide film operating as the adhesive.

According to the semiconductor device, since the polyimide film for insulating the semiconductor chip from the leads is used as the adhesive, two operations of insulating and joining between the semiconductor chip and the leads may simultaneously be carried out. Therefore, a configuration and fabrication method of the semiconductor device may be simplified as compared to a configuration in which an insulating material and an adhesive are individually provided.

The object described above is also achieved by the semiconductor device mentioned above, wherein the projections are respectively formed as one body with the leads.

According to the semiconductor device, the projection and the lead are formed as one body. Therefore, the configuration of the semiconductor device may be simplified as compared to a configuration in which the projection and the lead are individually formed with different materials.

The object described above is also achieved by the semiconductor device mentioned above, wherein the lines comprise wires.

According to the semiconductor device, since the wires are used for the lines, the lines may be flexibly connected between the electrode pads and the leads.

The object described above is also achieved by the semiconductor device mentioned above, wherein the semiconductor device further comprises bumps on the projections.

According to the semiconductor device, since the bumps are formed on the projections, the semiconductor device may easily be connected to the fabrication board as compared to a configuration in which the projections are directly provided to the fabrication board.

The object described above is also achieved by a method of manufacturing a semiconductor device comprising: (a) a lead forming process forming leads in which projections are formed at positions of external connection ports; (b) a joining process joining the leads with a semiconductor chip by sandwiching a polyimide film between the leads and the semiconductor chip and pressing and heating the leads and the semiconductor chip with a given pressure and a given temperature; (c) a connecting process electrically connecting leading lines between electrode pads formed on the semiconductor chip and the leads; and (d) a sealing-plastic providing process providing a sealing plastic to the lines and the semiconductor chip except for as least end faces of the projections.

According to the method of manufacturing the semiconductor device, in the joining process, the polyimide film operates as an adhesive when placed under the given temperature and the given pressure, and the semiconductor chip and the leads are joined by the polyimide film operating as the adhesive. Therefore, two operations of insulating and joining between the semiconductor chip and the leads may simultaneously be performed.

In the connection process, the electrode pads formed in the semiconductor chip and the leads are connected to each other using the lines. Therefore, by flexibly leading the lines, the layout of the leads may be adapted to the layout of the electrode pads.

Further, according to the method, the semiconductor device is manufactured in only four processes including the lead forming process, the joining process, the connecting process, and the sealing-plastic providing process. Therefore, the number of processes of fabricating the semiconductor device is small, and, thus, manufacturing efficiency may be improved.

The object described above is also achieved by the method mentioned above, wherein the polyimide film used in the joining process (b) comprises adhesives having thermal plasticity on both sides of the polyimide film.

According to the above method, the adhesives having thermal plasticity are provided on both sides of the polyimide film. Therefore, it is unnecessary to control a temperature of the polyimide film within a given range, and, thus, the joining process may easily be performed.

The object described above is also achieved by the method mentioned above, wherein the connecting process (c) further comprises a step of electrically connecting the electrode pads and the leads by using a direct lead bonding method.

According to the above method, in the connecting process, the electrode pads and the leads are electrically connected to each other by using the direct lead bonding method. Therefore, the connecting process of the electrode pads and the leads may be performed easily and positively.

The object described above is also achieved by a lead frame comprising: a plurality of leads, each including an inner lead part and an outer lead part, wherein a lead pitch of the inner lead part is smaller than that of the outer lead part; and projections, each being formed in the outer lead part as one body.

The object described above is also achieved by the lead frame mentioned above, wherein the lead pitch of the outer lead part is substantially the same as a thickness of the leads at positions of the projections, and the lead pitch of the inner lead part is substantially half the lead pitch of the outer lead part.

According to the above lead frames, the lead pitch of the inner lead part is set smaller than the lead pitch of the outer lead part. Therefore, even if a pitch of the electrode pads of the semiconductor chip is small, the inner lead parts may be adapted to the electrode pads. Further, since the lead pitch of the outer lead part to be electrically connected to the fabrication board is larger, fabricating performance of the semiconductor device to the fabrication board may be improved. Since the projection is formed in the outer lead part, the projection may be used for the external connection port. This also improves the fabricating performance of the semiconductor device.

The object described above is also achieved by a method of manufacturing a lead frame including a plurality of leads, each including an inner lead part and an outer lead part, wherein a lead pitch of the inner lead part is smaller than that of the outer lead part; and projections, each being formed in the outer lead part as one body, the method comprising: (a) a first etching process half etching a basic member in which a first mask for forming the projections is provided; and (b) a second etching process etching the basic member in which a second mask for forming the leads is provided.

According to the method of manufacturing the lead frame, in the first etching process, the basic member with the mask is half etched, and a thickness of the basic member except for the projection forming position is thinned. After the first etching process, in the second etching process, the basic member is provided with the mask for forming the leads, and is etched. As a result, the lead and the projection are formed as one body.

When the lead is formed, the pitch of the leads is determined by the thickness of the basic member. In further detail, only the leads having substantially the same pitch as the thickness of the basic member may be formed. Therefore, when a thinner basic member is used, the pitch of the leads may be narrowed.

However, in the leads having the projections, the thickness of the basic member is determined by the height of the projection. Therefore, in only one etching process for the basic member having the same thickness as the height of the projection, the narrow pitch leads cannot be formed.

Accordingly, as mentioned above, in the first etching process, the half etching process is carried out, and the thickness of the basic member except for the projection forming positions is thinned. Further, the second etching process is carried out for the thinned part to form the leads. In this way, even if the leads have the projections, the leads having the narrow pitch may be formed. And, also, as will be described later, the arrangement pitch of the projections may be narrowed to be substantially the same pitch as the thickness of the basic member.

The object described above is also achieved by a method of manufacturing a lead frame including a plurality of leads, each including an inner lead part and an outer lead part, wherein a lead pitch of the inner lead part is smaller than that of the outer lead part; and projections, each being formed in the outer lead part as one body, the method comprising: (a) a lead pattern forming process forming on a first basic member a lead pattern which has the same top shape as that of the leads; (b) a projection pattern forming process forming on a second basic member a projection pattern at least at positions of forming the projections; (c) a joining process joining the first basic member and the second basic member so that the lead pattern formed on the first basic member and the projection pattern formed on the second basic member are piled at the positions of forming the projections; and (d) a removing process removing needless parts of the first basic member and the second basic member; wherein when the first basic member and the second basic member are joined with each other, a thickness of a joined section is the same as a height of the projections.

According to the above method, when the first basic member and the second basic member are joined, the thickness of the joined section is the same as the height of the projection. Therefore, each thickness of the basic members is smaller than the thickness of the projection. In the lead pattern forming process, the lead pattern having a shape of the leads is formed in the thinner first basic member. From the relationship between the thickness of the basic member and the lead pitch mentioned above, the lead pitch of the lead pattern may be narrowed.

In the projection pattern forming process, in the second basic member, the projection pattern is formed at least at the positions where the projections are formed. In the joining process, the first basic member and the second basic member are piled and joined. In this way, the lead pattern and the projection pattern are layered at the position where the projections are formed. The thickness at the position may be the given height of the projections. In the removing process, the needless parts are removed to form the leads.

Accordingly, when the lead pattern is formed, the thickness of the basic member may be thinner, and, thus, the lead pitch may be narrowed. In the positions where the projections are formed, the lead pattern and the projection pattern are layered, and, thus, the projections having the given height may be formed.

The object described above is also achieved by a method of manufacturing a lead frame including a plurality of leads, each including an inner lead part and an outer lead part, wherein a lead pitch of the inner lead part is smaller than that of the outer lead part; and projections, each being formed in the outer lead part as one body, the method comprising: (a) a lead pattern forming process forming on a basic member a lead pattern which has the same top shape as that of the leads; (b) a projection forming process forming the projections on given positions of the lead pattern.

According to the above method, the lead pattern forming process forming the lead pattern and the projection forming process forming the projections are individually carried out. As a result, the thickness of the basic member may be selected regardless of the height of the projections. Therefore, by using the thinner basic member, the pitch of the lead pattern may be narrowed. In the projection forming process, the height of the projections may be flexibly designed, and, thus, flexibility of the design may be improved.

The object described above is also achieved by the method mentioned above, wherein the projection forming process (b) further comprises a step of forming the projections by providing at least one bump on the given positions of the lead pattern.

The object described above is also achieved by the method mentioned above, wherein the projection forming method (b) further comprises a step of forming the projections by providing a conductive material on the given positions of the lead pattern.

The object described above is also achieved by the method mentioned above, wherein the projection forming method (b) further comprises a step of forming the projections by plastically deforming the given positions of the lead pattern.

According to the above methods, in the projection forming process, the projections may easily be formed.

Other objects and further features of the present invention will be apparent from the following detailed description when read in conjunction with the accompanying drawings.

DESCRIPTION OF THE PREFERRED EMBODIMENTS

Figure 1:
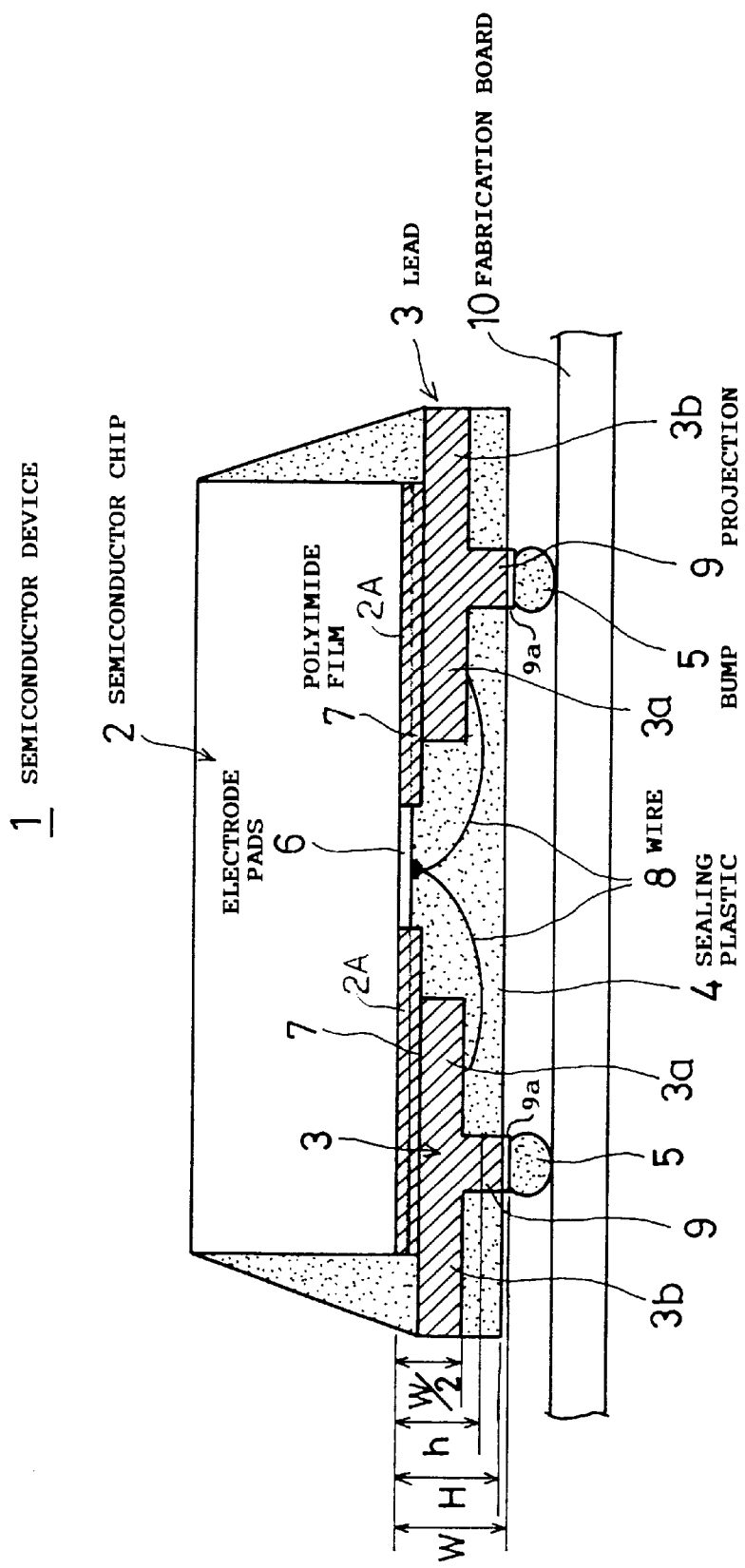
FIG. 1 shows a cross-sectional view of a first embodiment of a semiconductor device according to the present invention.
Figure 2:
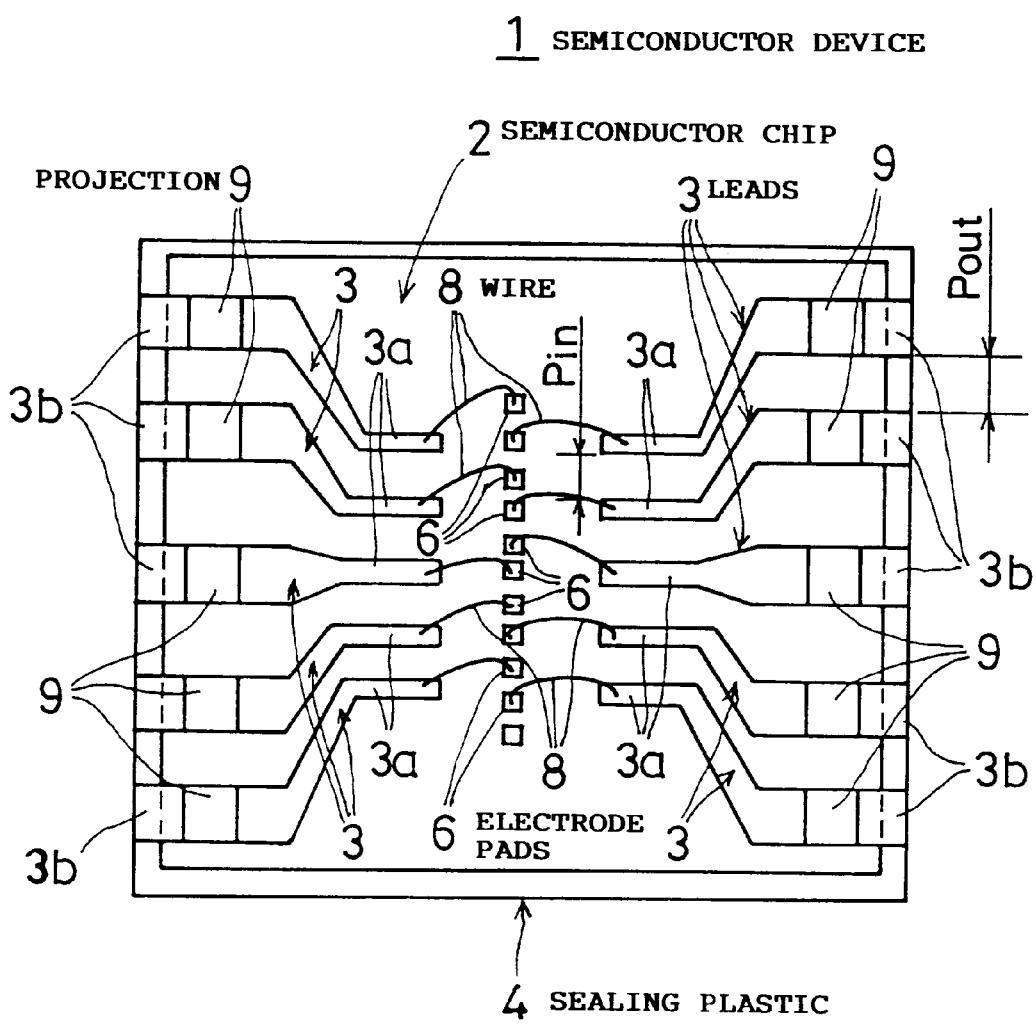
FIG. 2 shows a bottom view of the first embodiment of the semiconductor device according to the present invention.

First, a description will be given of a first embodiment of a semiconductor device according to the present invention, by referring to FIG. 1 and FIG. 2. FIG. 1 shows a cross-sectional view of the first embodiment of the semiconductor device according to the present invention. FIG. 2 shows a bottom view of the first embodiment of the semiconductor device according to the present invention.

In FIG. 1 and FIG. 2, a semiconductor device 1 includes a semiconductor chip 2, a plurality of leads 3, a sealing plastic 4, and bumps 5. In the semiconductor chip 2, a plurality of electrode pads 6 are arranged along a single line in the central position of a bottom face of the semiconductor chip 2. Each of the plurality of leads 3 has an inner lead part 3a and an outer lead part 3b, and contacts the bottom face of the semiconductor chip 2 via a polyimide film 7.

The polyimide film 7 operates as an insulation material for electrically insulating a circuit face formed on the bottom face of the semiconductor chip 2 from the leads 3. And also, the polyimide film 7 operates as an adhesive for bonding the leads 3 with the semiconductor chip 2. In this way, since the polyimide film 7 has two functions of the insulation material and the adhesive, the configuration of the semiconductor device 1 may be simplified, and, thus, the semiconductor device 1 may be easily manufactured as compared to a conventional semiconductor device in which the insulation material and the adhesive are individually provided.

Between the inner lead parts 3a and the electrode pads 6 formed in the semiconductor chip 2, wires 8 are arranged, and the semiconductor chip 2 and the leads 3 are electrically connected through the wires 8. Further, at a given position on the outer lead part 3b of each lead 3, a projection a is formed as a portion of the lead 3, and is operative as an external connection port. Most of the leads 3 are arranged on the bottom face of the semiconductor chip 2, namely, the leads 3 have a lead-on-chip structure (LOC). In this way, the semiconductor device 1 may be miniaturized.

The sealing plastic 4 is made of, for example, epoxy resin, and is formed by a molding to be discussed later. The sealing plastic 4 is provided at given areas of the bottom face and the side face of the semiconductor chip 2. Therefore, in this embodiment, since the sealing plastic 4 is not provided on a top face of the semiconductor chip 2, heat radiation may be improved.

A height (represented by a symbol "H") of the sealing plastic 4 from the bottom face of the semiconductor chip 2 is lower than a height (represented by a symbol "W") from the bottom face to the top end of the projection 9, and is higher than a height (represented by a symbol "h") from the bottom face to the highest part of the wire 8, (h≦H≦W). In such a configuration, at least a top end part 9a of the projection 9 is positively exposed from the sealing plastic 4, while the wire 8 and the lead 3 except for the exposed part of the projection 9 are sealed within the sealing plastic 4.

In this way, in the first embodiment of the semiconductor device 1, the given areas of the semiconductor chip 2 (except for the top face) are sealed by the sealing plastic 4. Therefore, heat-resistance, wet proofing, and mechanical strength may be improved. Further, since the sealing plastic 4 positively protects the wire 8, reliability of the semiconductor device 1 may be improved. And also, since at least the top end part 9a of the projection 9 is positively exposed from the sealing plastic 4 and is used for the external connection port, electrical connection between the semiconductor device 1 and a fabrication board 10 may be definitely performed.

In the following, a more detailed description will be given of the plurality of leads 3 arranged on the bottom face of the semiconductor chip 2, by referring to FIG. 2. To simplify the description, FIG. 2 shows a condition where the sealing plastic 4 provided on the bottom face of the semiconductor chip 2 is eliminated.

In FIG. 2, the leads 3 are designed such that a lead pitch (represented by "Pin") between two adjacent inner lead parts 3a is smaller than a lead pitch (represented by "Pout") between two adjacent outer lead parts 3b. In further detail, the lead pitch Pin of the inner lead parts 3a is designed to be substantially half the lead pitch Pout of the outer lead parts 3b (Pin=Pout/2). As will be discussed later, the lead pitch Pout of the outer lead parts 3b is designed to be substantially the same as the height W from the bottom face to the top face of the projection 9 (Pout=W).

As mentioned above, the lead pitch Pin of the inner lead parts 3a is designed to be smaller than the lead pitch Pout of the outer lead parts 3b. Therefore, even if an arrangement pitch of the electrode pads 6 of the semiconductor chip 2 is small, the inner lead parts 3a may be adapted to electrically connect with the electrode pads 6. Further, since the lead pitch Pout of the outer lead parts 3b to be electrically connected to the fabrication board 10 is large, ease of fabricating the semiconductor device 1 on the fabrication board 10 may be improved.

On the other hand, the first embodiment of the semiconductor device 1 does not have a configuration where the electrode pads 6 of the semiconductor chip 2 are connected to the fabrication board 10 via the bumps 5 directly formed on the electrode pads 6. On the contrary, in the semiconductor device 1, the electrode pads 6 of the semiconductor chip 2 are connected to the fabrication board 10 via the wires 8, the leads 3, and the bumps 5. Therefore, since the electrode pads 6 may flexibly be connected to the leads 3 via the wires 8, a layout of the leads 3 may be designed regardless of a layout of the electrode pads 6.

In further detail, in the embodiment shown in FIG. 2, the electrode pads 6 arranged in the central part of the semiconductor chip 2 are connected to the leads 3 via the wires 8, and the projections 9 of the leads 3 as the external connection ports are connectable at outer areas of the semiconductor chip 2.

Figure 3:
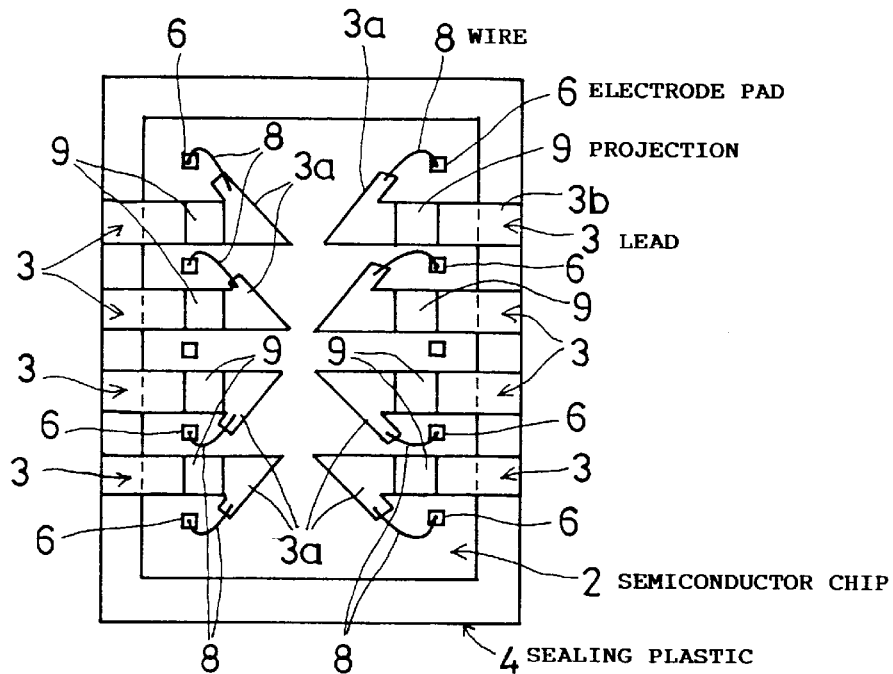
FIG. 3 shows a bottom view of a modification of the first embodiment of the semiconductor device according to the present invention.
Figure 4:
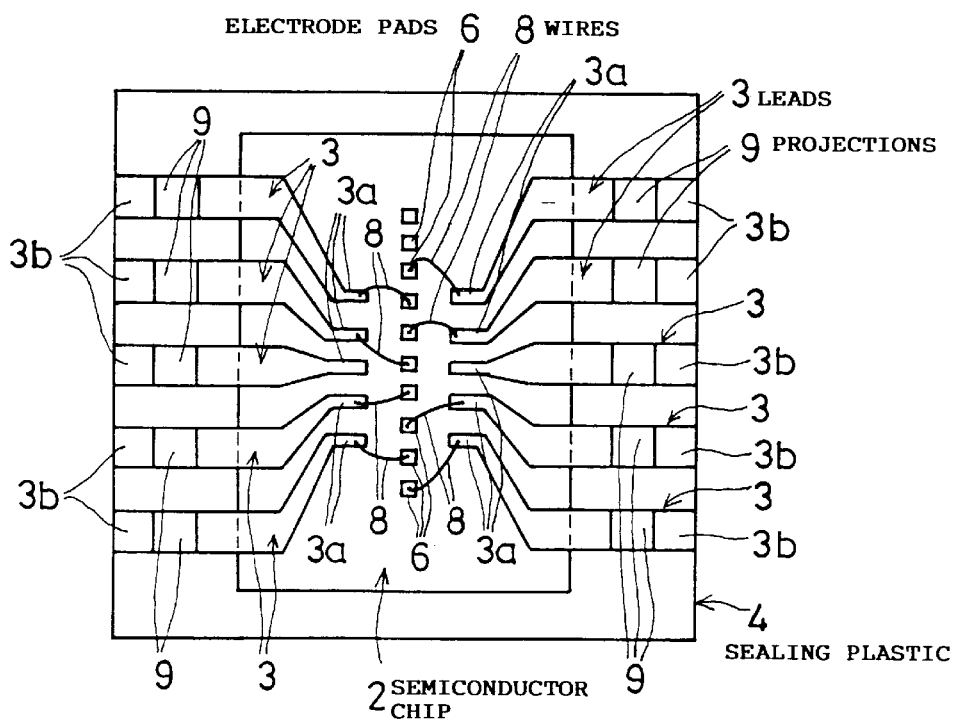
FIG. 4 shows a bottom view of another modification of the first embodiment of the semiconductor device according to the present invention.

FIG. 3 and FIG. 4 show bottom views of modifications of the first embodiment of the semiconductor device according to the present invention. FIG. 3 shows a case where the electrode pads 6 are formed at the outer areas of the semiconductor chip 2. In this case, if the electrode pads 6 are connected to the leads 3 via the wires 8 according to the present invention, the projections 9 as the external connection ports may be formed at an inner area from the arranged positions of the electrode pads 6. Further, as shown in FIG. 4, the projections 9 as the external connection ports may also be arranged outside the semiconductor chip 2.

In this way, since the electrode pads 6 can be connected to the leads 3 via the wires 8, ease of matching the semiconductor device 1 to the fabrication board 10 may be improved. Therefore, a layout of the projections 9 as the external connection ports may easily be designed to be a layout of standard external connection ports. Accordingly, a user work load using the semiconductor device 1 may be reduced.

Next, a description will be given of a method of manufacturing the above-mentioned semiconductor device 1. The semiconductor device 1 according to the present invention is manufactured by four basic processes including a lead forming process, a joining process, a connecting process and a sealing-plastic providing process, and by two accompanying processes including a bump forming process and a testing process. In the following, descriptions will be given for each process.

FIG. 5 to FIG. 9 show a first embodiment of the lead forming process. The lead forming process is a process for forming a lead frame 11 containing a basic member of the leads 3.

Figure 5:
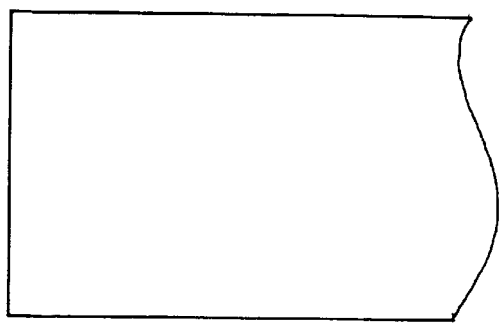
FIG. 5 shows an illustration for explaining a first embodiment of a method of manufacturing a lead frame according to the present invention, and shows a basic member.

For forming the lead frame 11, first, as shown in FIG. 5, a flat basic member 12 is prepared. The basic member 12 is made of a lead frame material such as 42 alloy, and a thickness of the basic member 12 is designed to be the same as the height W of the projection 9.

Figure 6:
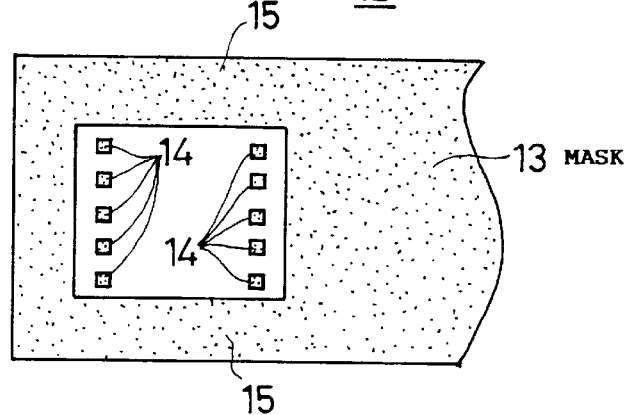
FIG. 6 shows an illustration for explaining the first embodiment of the method of manufacturing the lead frame according to the present invention, and shows a case where a mask is provided in a given position.

Next, as shown in FIG. 6, on the basic member 12, a mask 13 (shown by a dotted area) is provided. The mask 13 is provided for forming positions of the projections 9 (represented by a numeral 14) and for forming positions of cradles (represented by a numeral 15).

After the mask 13 is provided, a half etching process (a first etching process) is carried out for the basic member 12. In this embodiment, a wet etching method is used for the half etching process of the basic member 12 (other etching methods such as a dry etching process are also usable). An etching time is determined so that thickness of a part eroded by the etching (a part represented by a white area in FIG. 6) can be half the thickness W of the basic member 12.

Figure 7:
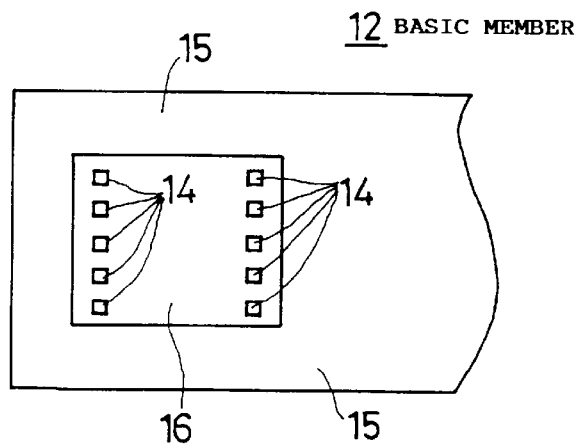
FIG. 7 shows an illustration for explaining the first embodiment of the method of manufacturing the lead frame according to the present invention, and shows the basic member after a first etching process is finished.

FIG. 7 shows the basic member 12 after the half etching process is finished and the mask 13 is removed. In this condition, the original thickness W of the basic member 12 is maintained in only the forming positions 14 of the projections 9 and the forming positions 15 of the cradles. In another position 16, the thickness becomes W/2 by the half etching process.

Figure 8:
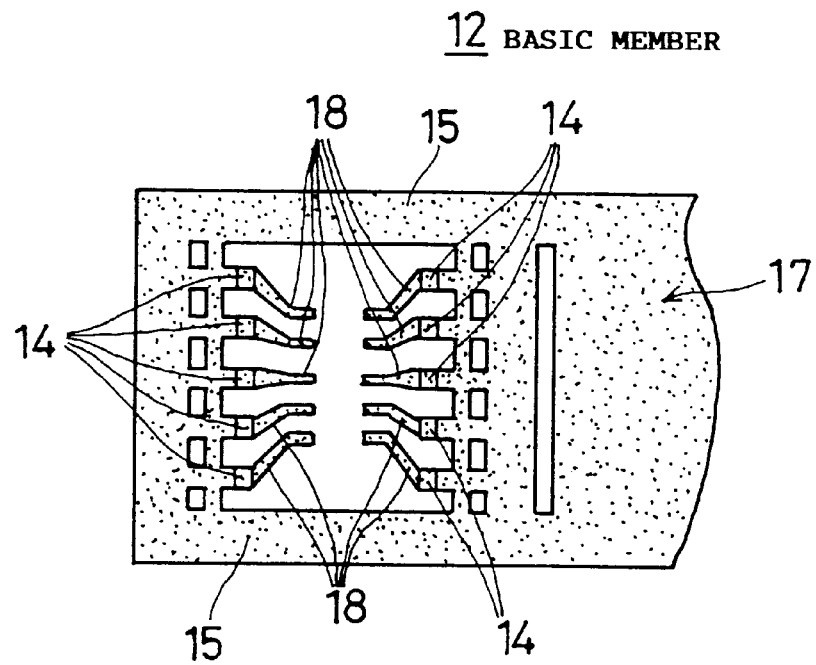
FIG. 8 shows an illustration for explaining the first embodiment of the method of manufacturing the lead frame according to the present invention, and shows a case where another mask is provided in a given position.

After the half etching process is finished, as shown in FIG. 8, a mask 17 (shown in a dotted area) is provided for forming positions 18 of the leads 3 and the forming positions 15 of the cradles, and the etching process is carried out for the basic member 12.

Figure 9:
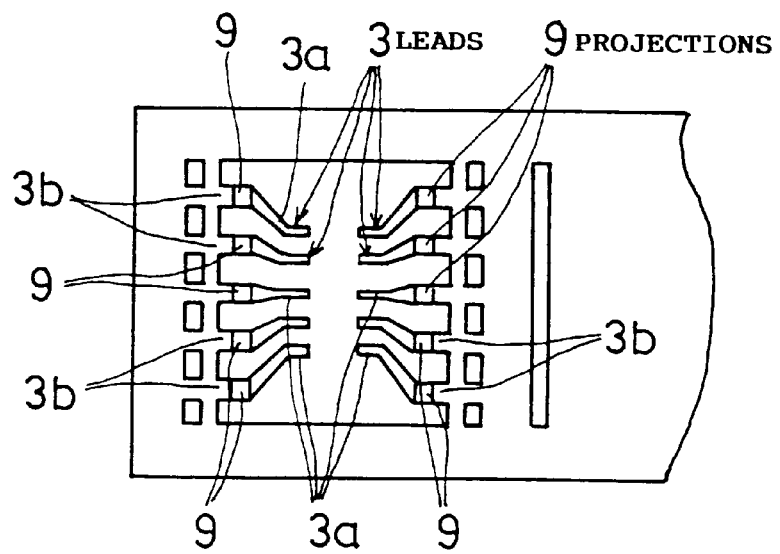
FIG. 9 shows an illustration for explaining the first embodiment of the method of manufacturing the lead frame according to the present invention, and shows a formed lead frame.

As mentioned above, after the mask 17 is provided, the etching process (a second etching process) is carried out for the basic member 12, and an uncovered area of the basic member is removed. Therefore, as shown in FIG. 9, the lead frame 11 having the plurality of leads 3 is formed, and each of the leads 3 has a given structure. The above processes can further comprise a process plating given parts (the forming positions of the leads 3) of the lead frame 11 with gold, etc.

In the lead frame thus formed, each lead 3 includes the inner lead part 3a, the outer lead part 3b and the projection 9. The height of the projection 9 is W, and the thickness of the inner lead part 3a and the thickness of the outer lead part 3b except for the projection 9 are respectively W/2.

Next, a description will be given of a relationship between the lead pitch and the thickness of the basic member 12. As mentioned above, when the leads 3 are formed, the lead pitch of the leads 3 is determined by the thickness of the basic member 12. In further detail, the lead pitch is determined to be substantially the same as the thickness of the basic member. Therefore, as the thickness of the basic member 12 is thinned, the lead pitch may be narrowed.

However, in the leads 3 having the projections 9, the thickness of the basic member 12 is determined by the height of the projection 9. Therefore, in only one etching process for the basic member 12 having the same thickness as the height of the projection 9, the narrow pitch leads cannot be formed.

Accordingly, as mentioned above, in the first etching process, the half etching process is carried out, and the thickness of the basic member 12 except for the projection forming positions 14 is thinned (W/2). Further, the second etching process is carried out for the thinned part to form the leads 3. In this way, even if the leads 3 have the projections 9, the leads 3 having the narrow pitch Pin may be formed. And, also, for the same reason, the arrangement pitch Pout of the projections 9 (outer lead parts 3b) may be narrowed to be substantially the same pitch as the thickness W of the basic member 12.

Structure examples where the thickness of the basic member 12 is 0.10 mm, 0.15 mm, and 0.20 mm are shown as follows. In the basic member 12 of thickness 0.10 mm, a minimum pitch Pout of the outer lead part 3b and the projection 9 is given by 0.10 mm (Pout=0.10 mm), a minimum pitch Pin of the inner lead part 3a is given by 0.05 mm (Pin=0.05 mm).

In the basic member 12 of thickness 0.15 mm, the minimum pitch Pout of the outer lead part 3b and the projection 9 is given by 0.15 mm (Pout=0.15 mm), the minimum pitch Pin of the inner lead part 3a is given by 0.075 mm (Pin=0.075 mm). In the basic member 12 of thickness 0.20 mm, the minimum pitch Pout of the outer lead part 3b and the projection 9 is given by 0.20 mm (Pout=0.20 mm), the minimum pitch Pin of the inner lead part 3a is given by 0.10 mm (Pin=0.10 mm).

On the other hand, the forming positions of the projections 9 are determined by the position of the mask 13 shown in FIG. 6. Namely, by changing the providing position of the mask 13 shown in FIG. 6, the forming positions of the projections 9 may flexibly be changed. Therefore, in the lead forming method according to the present invention, the forming positions of the projections 9 as the external connection ports may flexibly be set. Accordingly, the projections 9 may be formed in the predetermined positions of the standard external connection ports.

Next, a description will be given of a second embodiment of the lead forming process.

Figure 10:
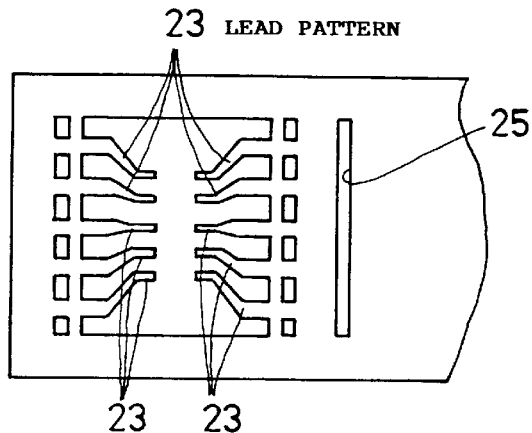
FIG. 10 shows an illustration for explaining a second embodiment of a method of manufacturing a lead frame according to the present invention, and shows a first basic member.
Figure 11:
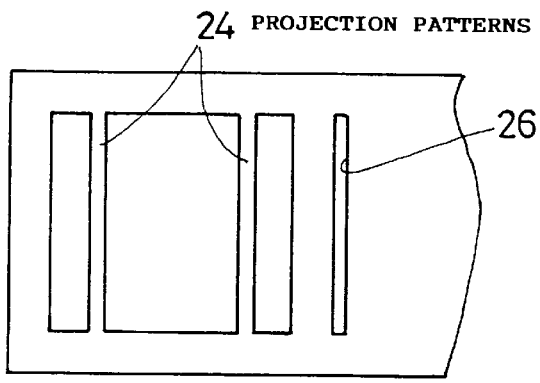
FIG. 11 shows an illustration for explaining the second embodiment of the method of manufacturing the lead frame according to the present invention, and shows a second basic member.

FIG. 10 to FIG. 15 show the second embodiment of the lead forming process of the method of manufacturing the semiconductor device according to the present invention. In the second embodiment, to form a lead frame 20, first, a first basic member 21 shown in FIG. 10 and a second basic member 22 shown in FIG. 11 are prepared.

Thicknesses of the basic members 21, 22 are respectively determined so that when the basic members 21, 22 are put together, an overall thickness of the basic members 21, 22 can be the same as the height W of the projection 9. In this embodiment, the thicknesses of the basic members 21, 22 are respectively designed to be W/2. However, the thicknesses of the basic members 21, 22 are not limited to the above example, but the thickness may be different values if the overall thickness is the same as the height W of the projection 9 when the basic members 21, 22 are put together.

The first basic member 21 shown in FIG. 10 is made of the lead frame material such as 42 alloy. When the etching process, a press-stamp-out process, etc., is previously carried out for the first basic member 21, lead patterns 23 are formed. The lead patterns 23 have the same top plan view as that of the leads 3. However, different from the lead forming process described in the first embodiment, no projection 9 is formed on the lead patterns 23 at present. Therefore, the thickness of the lead patterns 23 is given by W/2. In FIG. 10, an element represented by a numeral 25 is a positioning hole which is simultaneously formed when the lead patterns 23 are formed.

On the other hand, the second basic member 22 shown in FIG. 11 is made of the lead frame material such as 42 alloy.

When the etching process, the press-stamp-out process, etc., is carried out for the second basic member 22, projection patterns 24 are formed. The projection patterns 24 are straight patterns, and are formed so as to bridge the forming positions of the projections 9. In FIG. 11, an element represented by a numeral 26 is a positioning hole which is simultaneously formed when the projection patterns 24 are formed.

Figure 12:
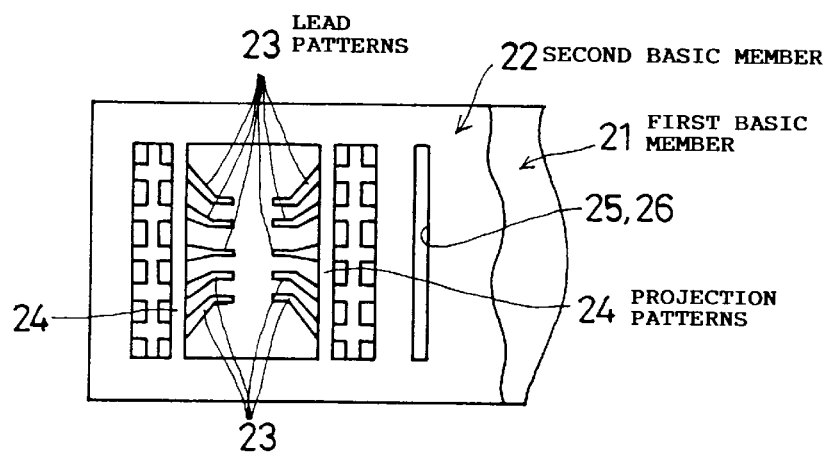
FIG. 12 shows an illustration for explaining the second embodiment of the method of manufacturing the lead frame according to the present invention, and shows a case where the first basic member and the second basic member are put together.

The first basic member 21 and the second basic member 22 thus formed are aligned with each other and are put together. In this case, the first and second basic members 21, 22 may be bonded to each other by using conductive adhesive. And, also, they may be bonded to each other by using welding. FIG. 12 shows a case where the first basic member 21 and the second basic member 22 are bonded to each other.

As mentioned above, when the first basic member 21 and the second basic member 22 are put together, the projection patterns 24 formed on the second basic member 22 are arranged on the projection forming positions of the lead patterns 23 formed on the first basic member 21.

Figure 13:
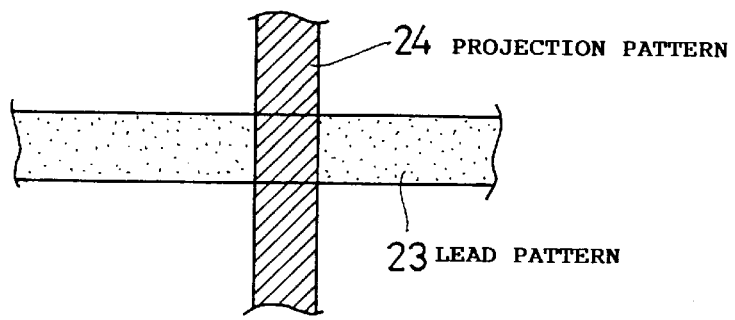
FIG. 13 shows an expanded illustration of a top plan view of a part where a lead pattern and a projection pattern cross each other.
Figure 14:
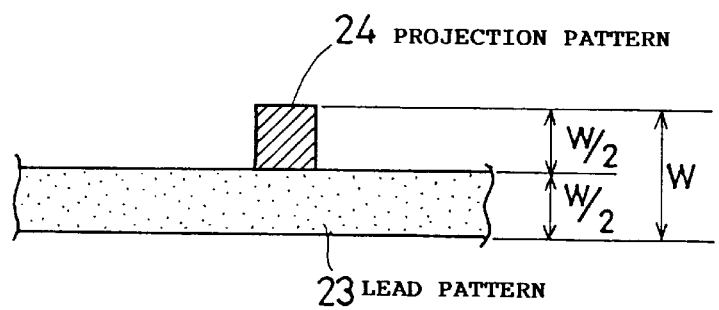
FIG. 14 shows an expanded illustration of a cross-sectional view of the part where the lead pattern and the projection pattern cross each other.

FIG. 13 shows an expanded illustration of a top plan view of a part where the lead pattern 23 and the projection pattern 24 cross each other. FIG. 14 shows an expanded illustration of a cross-sectional view of the part where the lead pattern 23 and the projection pattern 24 cross each other. As will easily be understood, when the lead pattern 23 of thickness W/2 and the projection pattern 24 of thickness W/2 cross each other, the overall thickness at the forming position of the projection 9 becomes W. In this way, at the forming position of the projection 9, the desired height W may be obtained as shown in FIG. 14.

Figure 15:
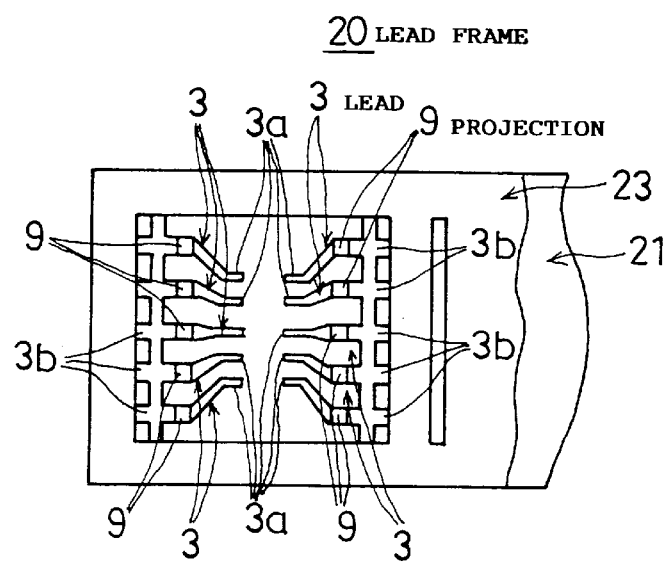
FIG. 15 shows an illustration for explaining the second embodiment of the method of manufacturing the lead frame according to the present invention, and shows another formed lead frame.

After the connecting process of the first basic member 21 and the second basic member 22 is finished, unnecessary parts, for example, parts except for the crossed parts of the projection patterns 24 and the lead patterns 23, are removed by the pressing process, etc. As a result, as shown in FIG. 15, lead frame 20 is formed. The lead frame 20 has the leads 3 where the projections 9 are formed as one body.

In the lead frame 20 manufactured by the second embodiment of the present method, similar to the lead frame 11 manufactured by the first embodiment, the lead 3 in the lead frame 20 includes the inner lead part 3a, the outer lead part 3b, and the projection 9. When the lead pattern 23 shown in FIG. 10 is formed, the thickness of the first basic member 21 is given by W/2. Therefore, as will be understood from the previously-mentioned relationship between the thickness and the lead pitch, the narrow pitch lead patterns 23 may be formed.

On the other hand, the forming positions of the projections 9 are determined by the forming position of the projection patterns 24 formed on the second basic member 22. Namely, by changing the forming position of the projection patterns 24, the forming positions of the projections 9 may flexibly be changed. Therefore, in the lead forming method according to the second embodiment, the forming positions of the projections 9 as the external connection ports may flexibly be set. Accordingly, the projections 9 may easily be formed in the predetermined positions of the standard external connection ports.

After the lead frame 11 or 20 is formed in the lead forming process, the connecting process connecting the lead frame 11 or 20 to the semiconductor chip 2 is carried out. In the following, a description of the connecting process for the lead frame 11 will be given by referring to FIG. 16 to FIG. 20.

Figure 16:
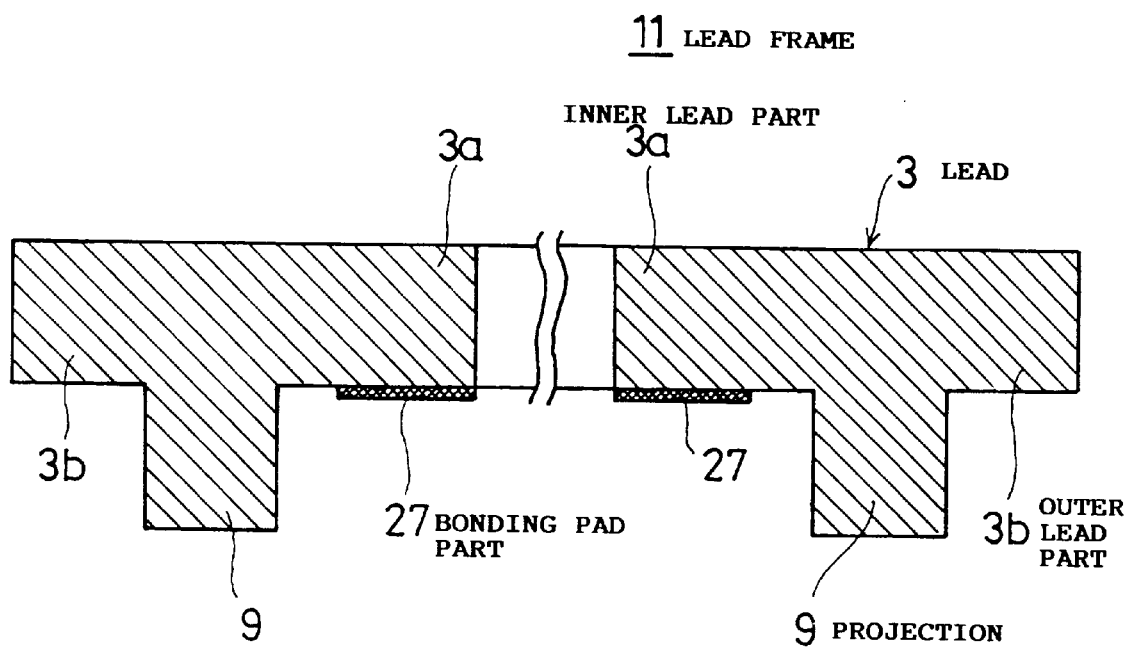
FIG. 16 shows an illustration for explaining a joining process in the manufacturing process of the semiconductor device according to the present invention, and shows an illustration for explaining forming of bonding pads.

FIG. 16 to FIG. 20 show illustrations for explaining the joining process in the manufacturing process of the semiconductor device according to the present invention. As shown in FIG. 16, in the joining process, the inner lead part 3a of the lead frame 11 is plated with gold, and, thus, a bonding pad part 27 is formed, to which the wire 8 is bonded in the connecting process discussed later.

Figure 17:
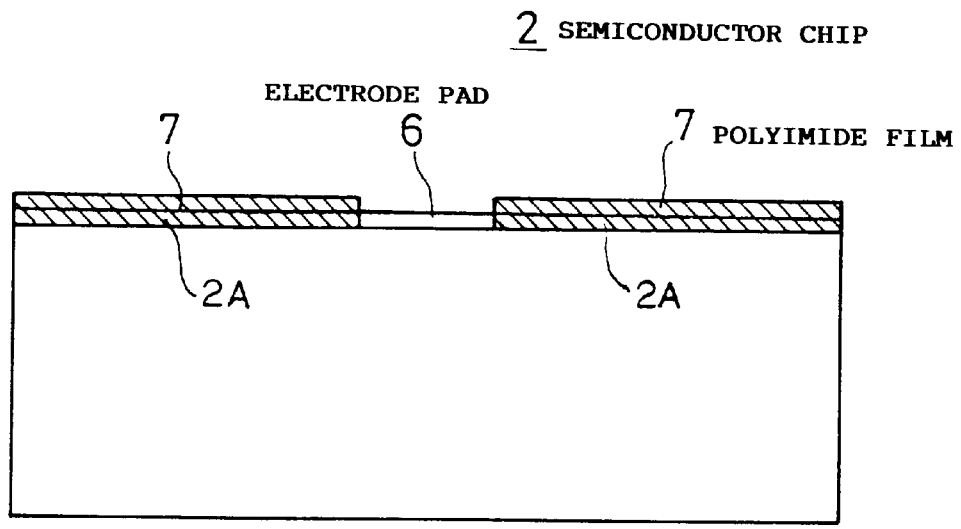
FIG. 17 shows an illustration for explaining the joining process in the manufacturing process of the semiconductor device according to the present invention, and shows an illustration for explaining a process providing a polyimide film to a semiconductor chip.

FIG. 17 shows a process providing the polyimide film 7 to the semiconductor chip 2. In FIG. 17, on the same face as that of the electrode pads 6 of the semiconductor chip 2, the polyimide film 7 is provided so that only the electrode pad 6 can be exposed from the polyimide film 7. For the polyimide film 7, a material in which a transition point to glass is 100 to 300° C. is selected. In FIG. 17, the polyimide film 7 is merely put on the semiconductor chip 2 and is not connected to the semiconductor chip 2. Therefore, to prevent the polyimide film 7 from dropping away, the semiconductor chip 2 is arranged so that the face of the electrode pad 6 is oriented upward. At this time, plastic sealing is not carried out, and the semiconductor chip 2 is given as a bare chip. Further, it is possible to provide the polyimide film 7 on the semiconductor chip 2 by also using a wafer process producing the semiconductor chip 2.

Figure 18:
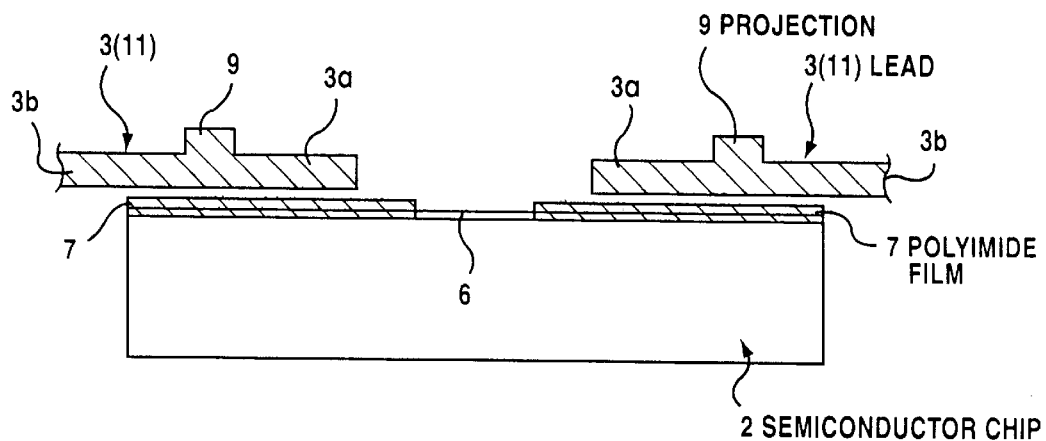
FIG. 18 shows an illustration for explaining the joining process in the manufacturing process of the semiconductor device according to the present invention, and shows an illustration for explaining a process arranging the lead frame over a semiconductor chip.

FIG. 18 shows a process arranging the lead frame to the semiconductor chip 2. As shown in FIG. 18, after the polyimide film 7 is provided on the semiconductor chip 2, the lead frame 11 is put on the semiconductor chip 2. At this time, the leads 3 (inner lead parts 3a) formed in the lead frame are adjusted to the electrode pads 6 formed in the semiconductor chip 2 with high precision, and, thus, the lead frame 11 is positioned.

Figure 19:
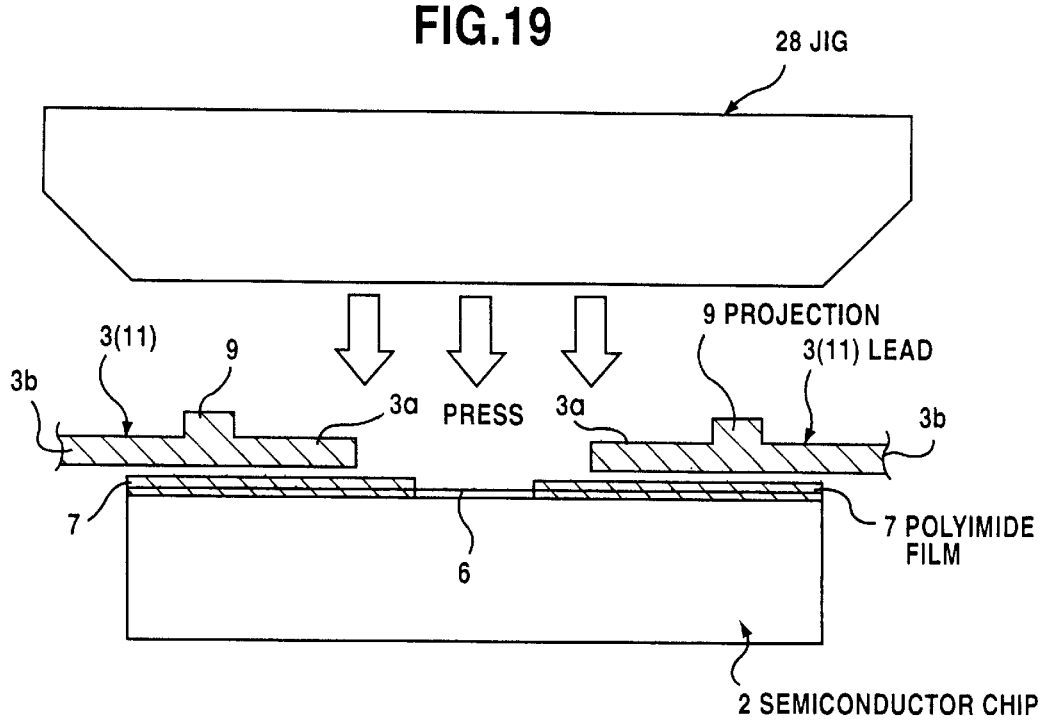
FIG. 19 shows an illustration for explaining the joining process in the manufacturing process of the semiconductor device according to the present invention, and shows an illustration for explaining a process joining the semiconductor chip with the lead frame through the polyimide film being operative as an adhesive.

FIG. 19 shows a process joining the semiconductor chip with the lead frame through the polyimide film being operative as an adhesive. When the lead frame 11 is put on the given position of the semiconductor chip 2, as shown in FIG. 19, a jig 28 falls down and presses the lead frame 11 to the semiconductor chip 2. The jig 28 has a heating device, and heat generated in the jig 28 is applied to the polyimide film 7 through the lead frame 11.

The polyimide film 7 is an insulating material for electrically insulating the semiconductor chip 2 from the lead frame 11 and is commonly used. However, the inventor newly found that the polyimide film 7 is operable as the adhesive when the polyimide film 7 is provided under a given atmospheric condition. In further detail, for the polyimide film 7, the material in which the transition point to glass is 100 to 300° C. is used. When the polyimide film 7 is heated to the transition point to glass of 100 to 300° C., and pressure of 1 to 10 kgf/cm$^2$ is applied to the polyimide film 7, the polyimide film is operable as the adhesive.

Therefore, when the semiconductor chip 2 and the lead frame 11 are joined with each other, the polyimide film 7 is heated by the heater equipped in the jig 28 to the transition point to glass of 100 to 200° C. And, also, the jig 28 falls down, and the polyimide film 7 is pressed by the jig 28 at pressure of 1 to 10 kgf/cm$^2$. In this way, the polyimide film 7 operates as the adhesive, and, thus, the semiconductor chip 2 may firmly contact the lead frame 11 by using the polyimide film 7.

Figure 20:
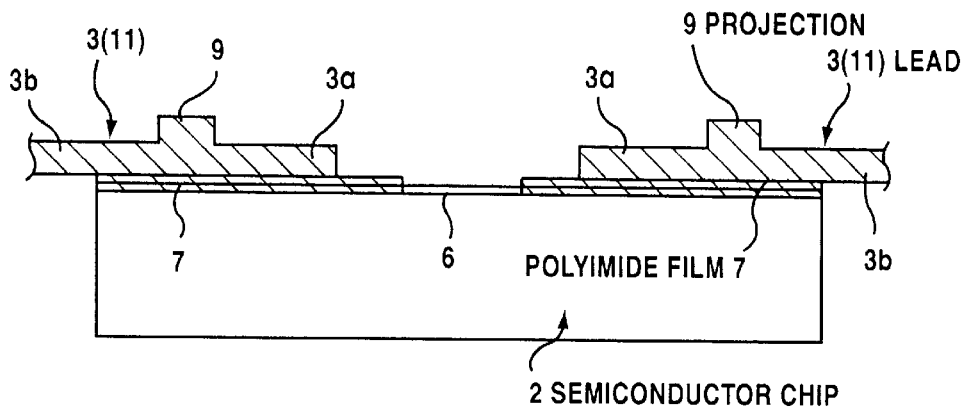
FIG. 20 shows an illustration for explaining the joining process in the manufacturing process of the semiconductor device according to the present invention, and shows a case where the semiconductor chip is joined with the lead frame through the polyimide film.

In conventional semiconductor devices, an adhesive is required for bonding the polyimide film to the semiconductor chip 2 and the lead frame 11. However, in the semiconductor device according to the present invention, such an adhesive is not necessary. Therefore, manufacturing cost may be reduced, and the number of processes for manufacturing the semiconductor device 1 may be reduced. FIG. 20 shows a case where the semiconductor chip 2 is joined with the lead frame 11 through the polyimide film 7.

In the present invention, the joining of the semiconductor chip 2 and the lead frame 11 is not limited to the joining method using the polyimide film 7. It is possible to use the conventional method. In the conventional method, an adhesive is applied to both sides of the polyimide film, and the semiconductor chip 2 and the lead frame 11 are joined with each other through the polyimide film applied with the adhesive. In this method, temperature control and pressure control for the polyimide film are unnecessary, and, thus, the joining process may be simplified.

After the semiconductor chip 2 and the lead frame 11 are joined with each other in the joining process, the connecting process is carried out. In the connecting process, the leads 3 formed in the lead frame 11 are electrically connected to the electrode pads 6 formed in the semiconductor chip 2 through the wires 8.

Figure 21:
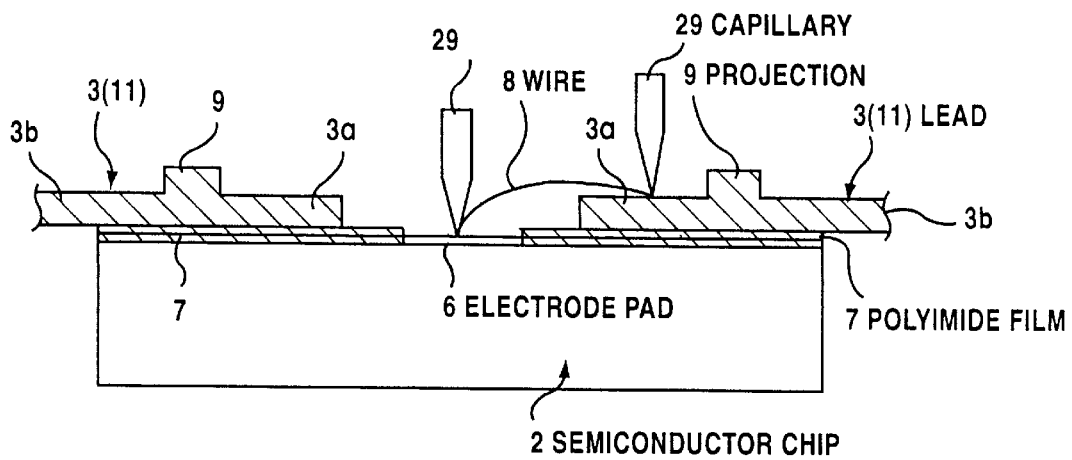
FIG. 21 shows an illustration for explaining a connecting process in the manufacturing process of the semiconductor device according to the present invention, and shows an illustration for explaining a process connecting a wire by using a capillary.

FIG. 21 shows an illustration for explaining a process connecting the wire 8 (for example gold wire) between the bonding pad part 27 (referred to FIG. 16) formed in the lead 3 and the electrode pad 6 by using a capillary 29. As is well known, to improve the electrical performance of the semiconductor device 1, a shorter wire 8 is better. And, for miniaturizing and thinning of the semiconductor device 1, it is better that a height of a loop of the wire 8 is lower.

Therefore, it is desirable that a low-loop bonding method is used for bonding the wires 8. At present, a variety of low-loop bonding methods are proposed. In one of the methods, first, the wire 8 is bonded to the electrode pad 6 formed in the semiconductor chip 2, and subsequently, by moving the capillary 29 upward and moving it in a horizontal direction, the wire 8 is bonded to the lead 3. In another method, the order of bonding is reversed.

Figure 22:
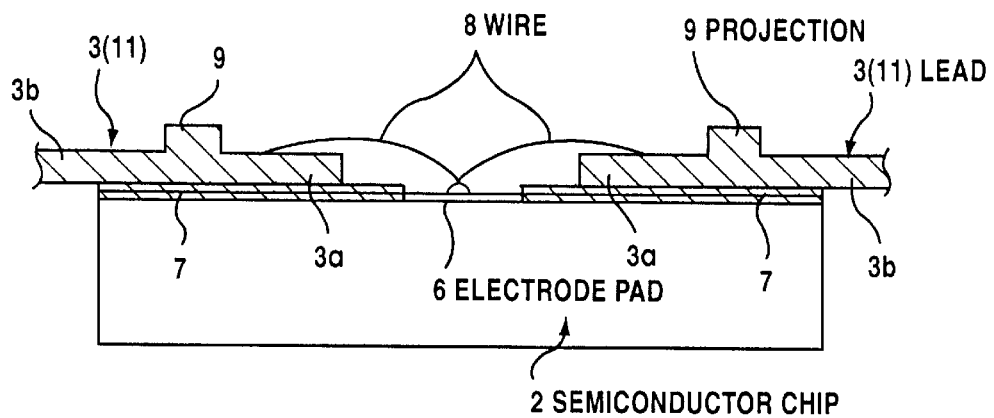
FIG. 22 shows an illustration for explaining the connecting process in the manufacturing process of the semiconductor device according to the present invention, and shows a case where the wires are connected between the electrode pad and the leads.

As mentioned above, by using the wire bonding method to electrically connect the leads 3 and the electrode pads 6, the connecting process may be carried out easily and rapidly. Further, the wires 8 may flexibly be connected between the leads 3 and the electrode pads 6. FIG. 22 shows the wires 8 connected between the leads 3 and the electrode pads 6 after the connecting process is carried out.

After the electrode pads 6 and the leads 3 are electrically connected by the wires 8 in the connecting process, the sealing-plastic providing process is carried out. In the sealing-plastic providing process, the sealing plastic 4 is provided to the given part of the semiconductor chip 2. In the following, the sealing-plastic providing process will be discussed by referring to FIG. 23 to FIG. 25.

Figure 23:
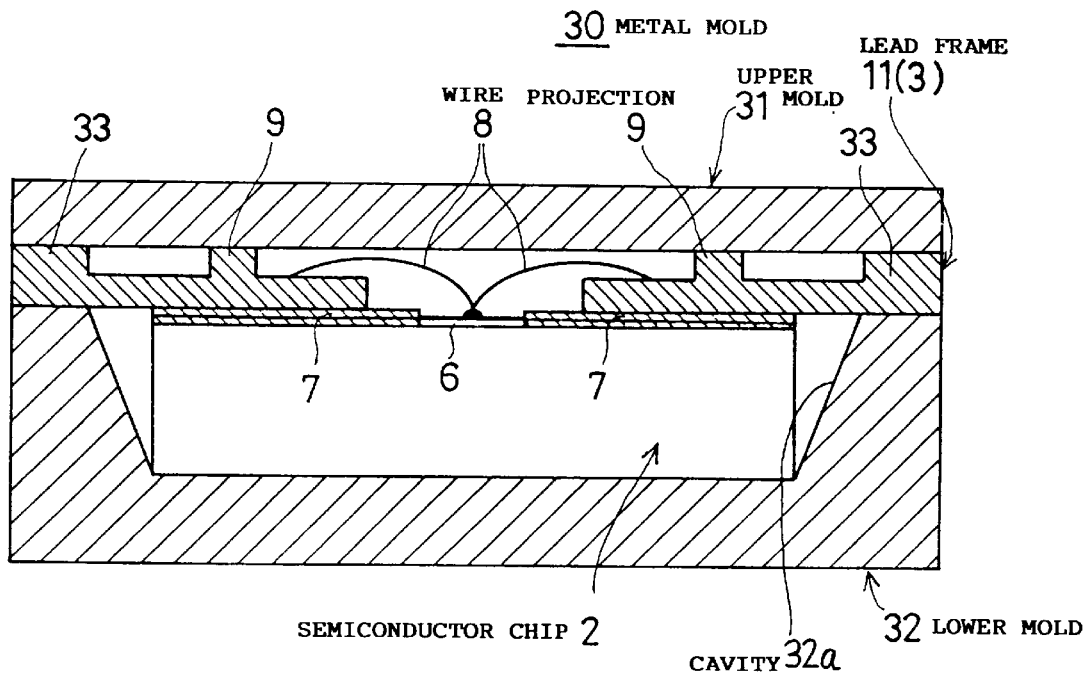
FIG. 23 shows an illustration for explaining a sealing-plastic providing process in the manufacturing process of the semiconductor device according to the present invention, and shows a case where the semiconductor chip is mounted in a metal mold.

FIG. 23 shows a case where the semiconductor chip 2 is provided in a metal mold 30. In the semiconductor chip 2, the lead frame 11 and the wires 8, etc., are provided through the above-mentioned processes. The metal mold 30 comprises an upper mold 31 and a lower mold 32. With the lead frame 11 being cramped between the upper mold 31 and the lower mold 32, the semiconductor chip 2 is placed within the metal mold 30.

The upper mold 31 contacts the projection 9 and the cradle 33 of the lead frame 11 when the semiconductor chip 2 is placed within the metal mold 30. Since the height of the projection 9 and the height of the cradle 33 are the same, the upper mold 31 has a flat plate shape. The lower mold 32 has a cavity 32a. When the semiconductor chip 2 is placed in the lower mold 32, spaces are generated on both sides of the semiconductor chip 2. The top face of the semiconductor chip 2 contacts a bottom face of the cavity 32a.

In this way, since the upper mold 31 used in the sealing-plastic providing process has a flat plate shape, and the cavity formed in the lower mold 32 has a simple shape, a cost for producing the metal mold 30 may be reduced. The cost reduction of the metal mold 30 may contribute to a cost reduction of the semiconductor device 1.

Figure 24:
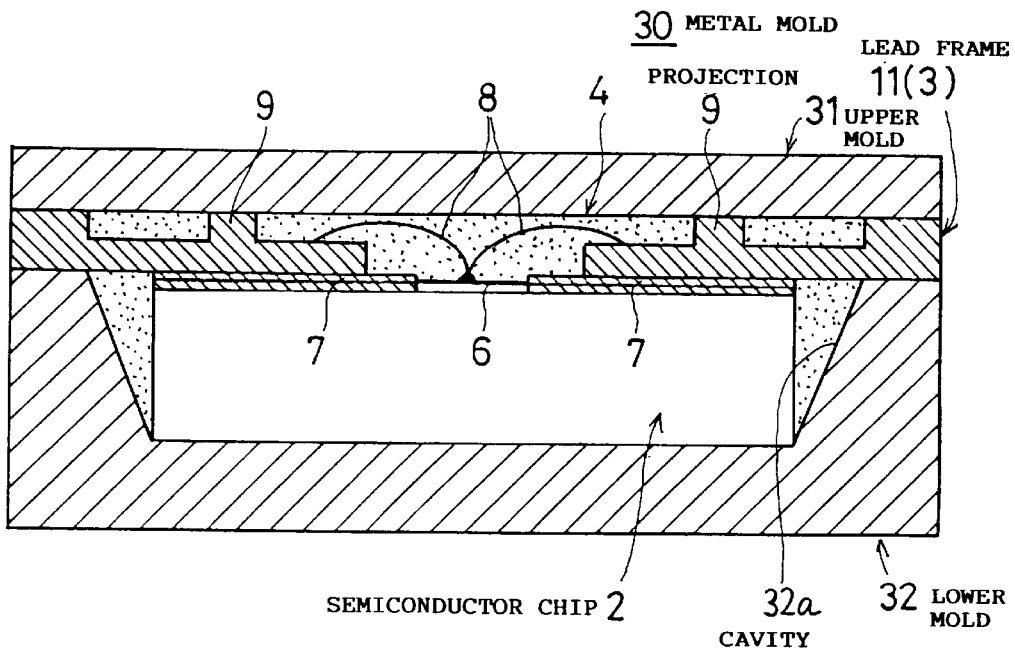
FIG. 24 shows an illustration for explaining the sealing-plastic providing process in the manufacturing process of the semiconductor device according to the present invention, and shows a case where the sealing plastic is provided to the metal mold.

FIG. 24 shows a case where the sealing plastic 4 (shown by dotted areas) is provided to the metal mold 30. By providing the sealing-plastic 4 to the metal mold 30, outside faces of the semiconductor chip 2 except for a face contacting the lower mold 32 (the bottom face of the cavity 32a) are sealed by the sealing plastic 4. And, the leads 3 and the wires 8 fabricated in the bottom face of the semiconductor chip 2 are also sealed by the sealing plastic 4. Further, the projections 9 except for end parts contacting the upper mold 31 are sealed by the sealing plastic 4.

Figure 25:
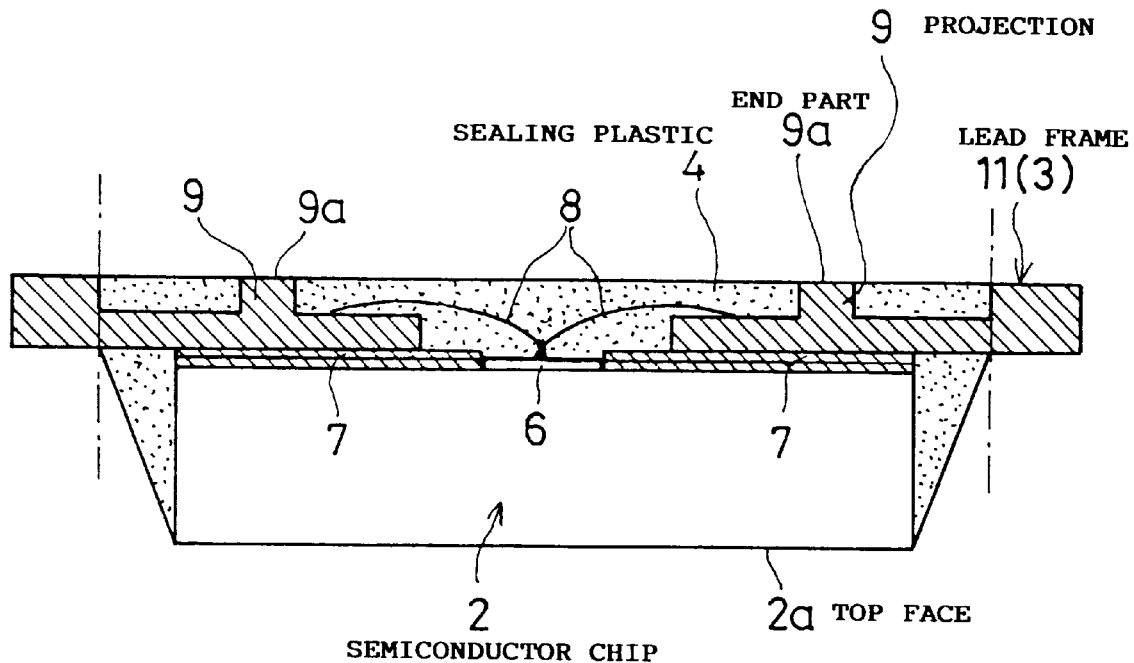
FIG. 25 shows an illustration for explaining the sealing-plastic providing process in the manufacturing process of the semiconductor device according to the present invention, and shows a case where the plastic-sealed semiconductor chip is separated from the metal mold.

FIG. 25 shows a case where the semiconductor chip 2 provided with the sealing plastic 4 is separated from the metal mold 30. As shown in FIG. 25, the top face 2a of the semiconductor chip 2 is exposed from the sealing plastic 4. Therefore, from this top face 2a, the heat generated in the semiconductor chip 2 may efficiently be radiated. Further, the end part 9a of the projection 9 is exposed from the sealing plastic 4. Therefore, the end part 9a may be used as the external connection port.

In the case shown in FIG. 25, when the lead frame 11 is cut at lines represented by single-dotted chain lines, the semiconductor device shown in FIG. 25 may have the same effect as that of the semiconductor device 1 shown in FIG. 1. However, in the case shown in FIG. 25, since the end part 9a of the projection 9 to be used for the external connection port has substantially the same surface as that of the sealing plastic 4, the semiconductor device shown in FIG. 25 may not positively be connected to the fabrication board 10. Therefore, in the embodiment, after the sealing-plastic providing process is finished, the bump forming process forming the bump on the end part 9a is carried out. In the following, the bump forming process will be discussed by referring to FIG. 26 to FIG. 30.

Figure 26:
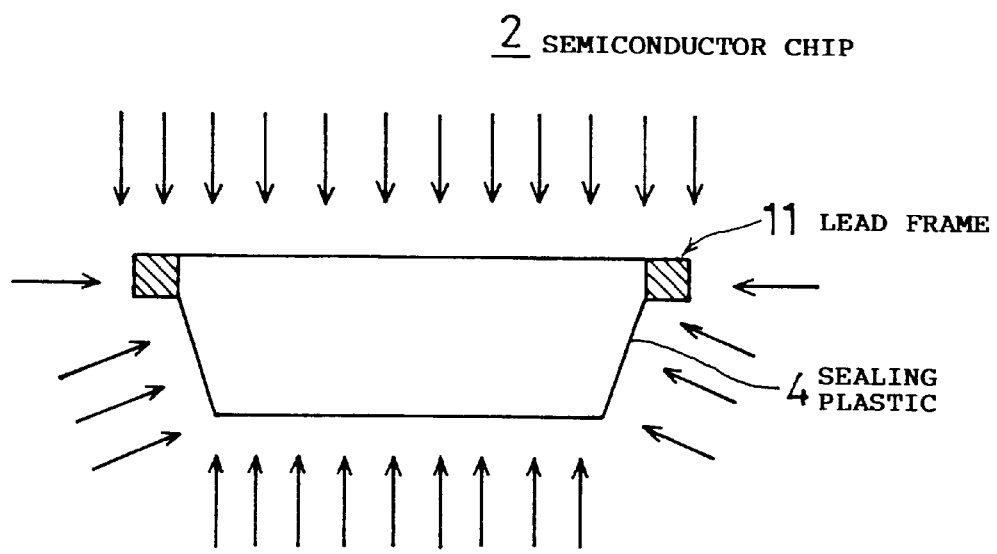
FIG. 26 shows an illustration for explaining a bump forming process in the manufacturing process of the semiconductor device according to the present invention, and shows a case where a honing process is carried out.

In the bump forming process, as shown in FIG. 26, for all faces of the semiconductor chip 2 after the sealing plastic 4 is provided, a honing process is carried out. By the honing process, remaining plastic chips, etc., are removed and the end part 9a of the projection 9 is positively exposed externally.

Figure 27:
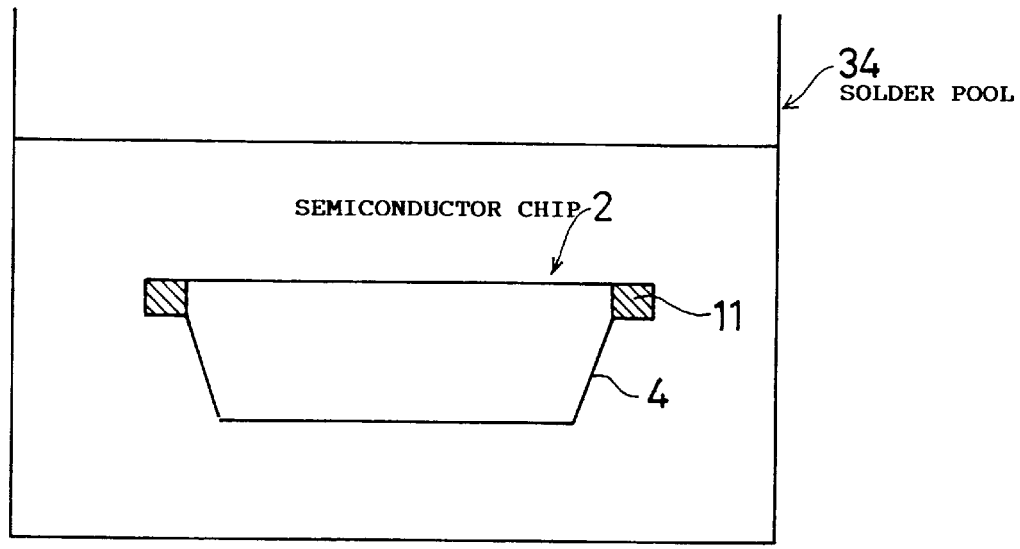
FIG. 27 shows an illustration for explaining the bump forming process in the manufacturing process of the semiconductor device according to the present invention, and shows a case where an exterior plating process is carried out.
Figure 28:
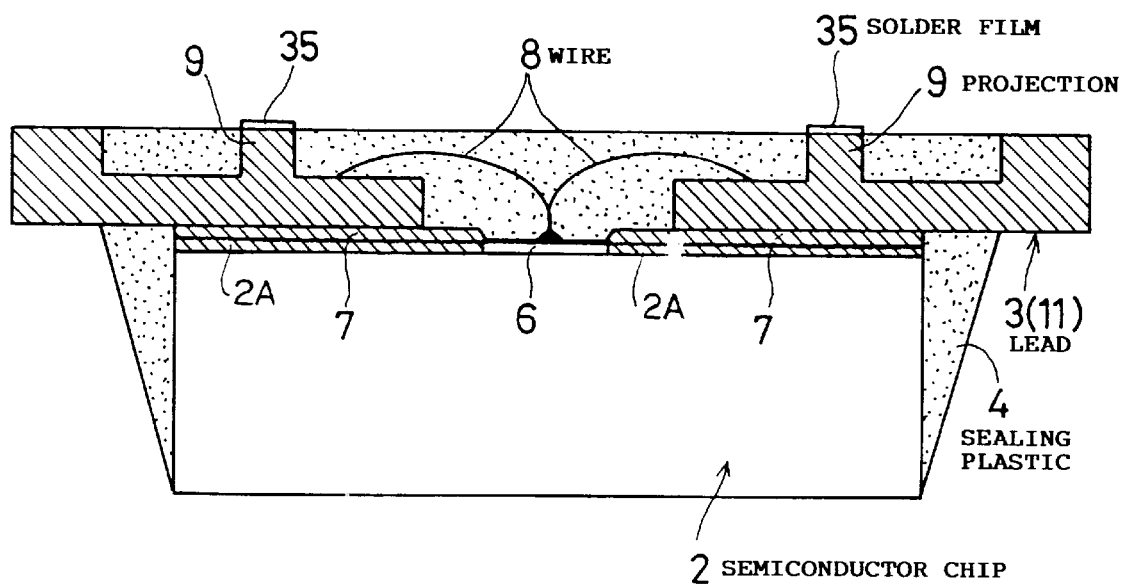
FIG. 28 shows an illustration for explaining the bump forming process in the manufacturing process of the semiconductor device according to the present invention, and shows a case where the exterior plating process is finished.

After the honing process is finished, as shown in FIG. 27, the semiconductor chip 2 provided with the sealing plastic 4 is dipped in a solder pool 34 to externally plate the end part 9a of the projection 9 with solder. For the solder used for the external plating, a composition ratio of Pb/Sn=1/9 is usable. FIG. 28 shows a case where a solder film 35 is formed on the end part 9a of the projection 9 by the external plating.

Figure 29:
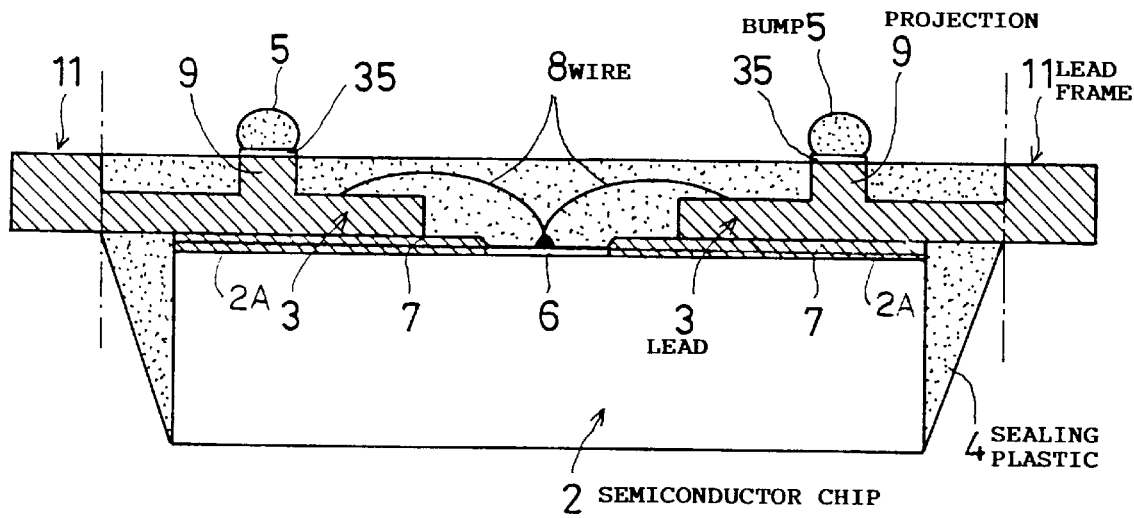
FIG. 29 shows an illustration for explaining the bump forming process in the manufacturing process of the semiconductor device according to the present invention, and shows a case where bumps are formed.

After the external plating process is finished, the bump 5 is formed on the solder film 35 formed on the end part 9a of the projection 9. To form the bumps 5, a variety of methods are usable. FIG. 29 shows a case where the bump 5 is formed on the end part 9a of the projection 9.

Figure 30:
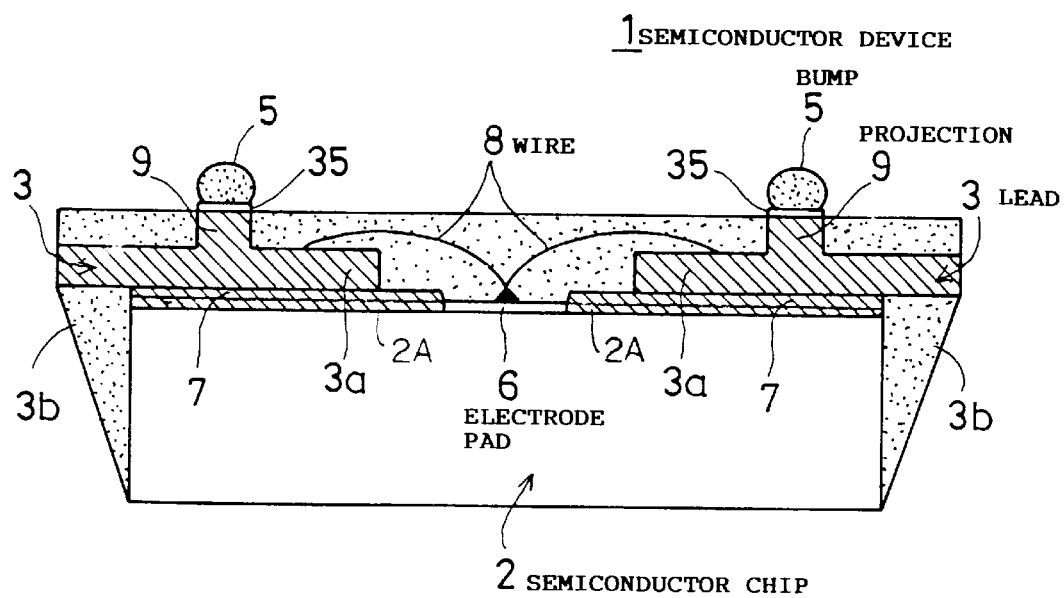
FIG. 30 shows an illustration for explaining the bump forming process in the manufacturing process of the semiconductor device according to the present invention, and shows the semiconductor device after all of processes are finished.

When the bump 5 is formed on the end part 9a of the projection 9, the lead frame 11 is cut at lines represented by single-dotted chain lines shown in FIG. 29. As a result, the semiconductor device 1 shown in FIG. 30 is formed. In the above process, it is possible to carry out the half etching process for the cut section of the lead frame 11 before the cutting process of the lead frame 11, to ease the cutting process.

Figure 31:
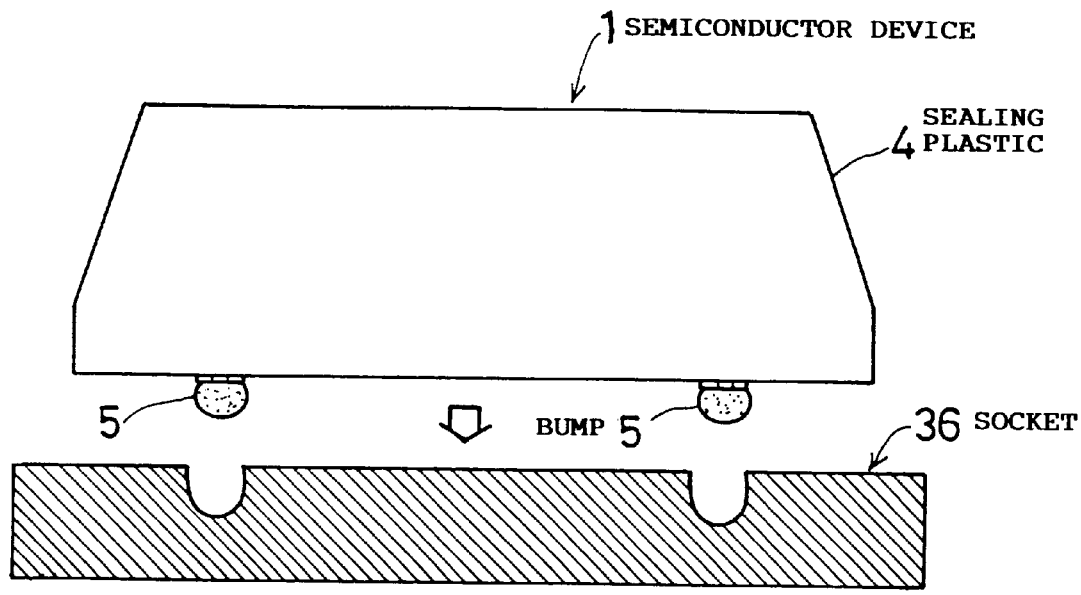
FIG. 31 shows an illustration for explaining a testing process of the semiconductor device according to the present invention, and shows a method of testing by using a socket.
Figure 32:
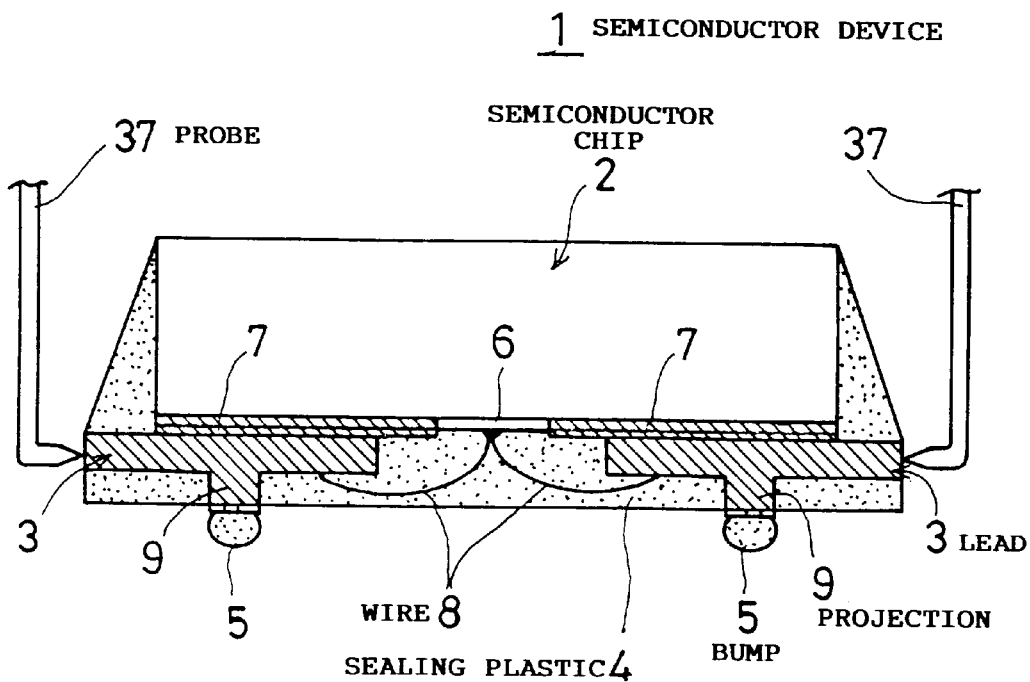
FIG. 32 shows an illustration for explaining the testing process of the semiconductor device according to the present invention, and shows a method of testing by using a probe.

For the semiconductor device 1 thus manufactured, the testing process testing whether the semiconductor device 1 operates properly is carried out. FIG. 31 and FIG. 32 show different testing methods of the semiconductor device 1. In the testing method shown in FIG. 31, sockets 36 on which the bumps 5 are mountable are used. Therefore, the semiconductor device 1 is attached to the sockets 36, and the tests such as burn-in are carried out.

In the testing method shown in FIG. 32, the semiconductor device 1 is tested by using a probe 37. In the semiconductor device 1 shown in FIG. 32, an end part of the lead 3 is exposed from the side of the sealing plastic 4. In this testing method, by contacting the probe 37 to the exposed end part of the lead 3, the semiconductor device 1 is tested. When this testing method is used, even if the semiconductor device 1 is mounted on the fabrication board 10, it is possible to test the semiconductor device 1.

Figure 33:
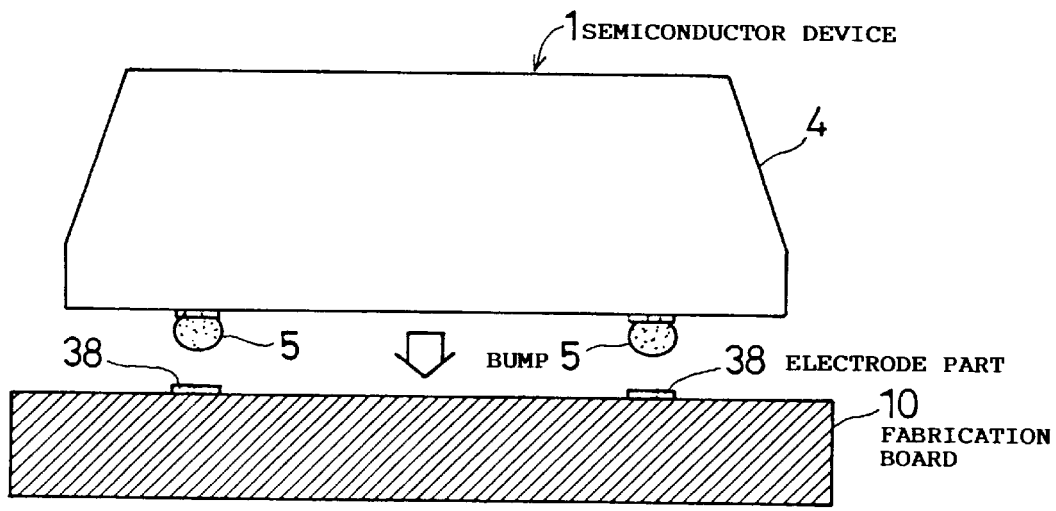
FIG. 33 shows an illustration for explaining a fabricating process connecting the semiconductor device according to the present invention to the fabrication board.
Figure 34A:
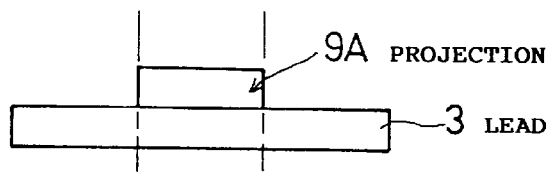
FIG. 34A to FIG. 34C show modifications of the projection, whose top shapes are different.
Figure 34B:
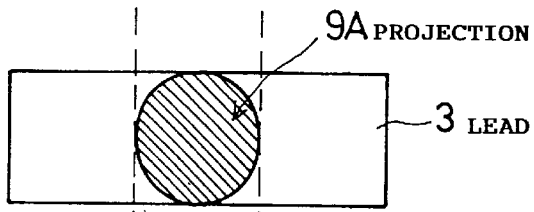
Figure 34C:
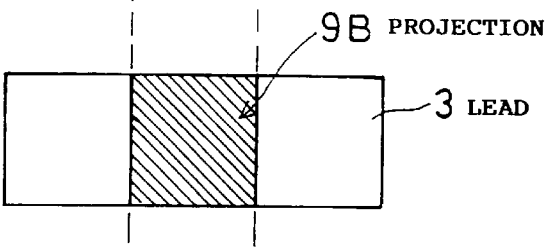

FIG. 33 shows the fabricating process for connecting the semiconductor device 1 on the fabrication board 10. For connecting the semiconductor device 1 on the fabrication board 10, a variety of known methods are usable. For example, in one method using an infrared reflow method, the bumps 5 formed in the semiconductor device 1 are temporarily fixed to electrode parts 38 formed on the fabrication board 10 by using paste, etc. After that, by melting the bumps 5 in an infrared reflow hearth, the bumps 5 and the electrode parts 38 are joined with each other.

Next, descriptions will be given of modifications of the above-mentioned methods of fabricating the semiconductor device.

FIG. 34A to FIG. 37C show modifications of the projection 9. In a projection 9A shown in FIG. 34A and FIG. 34B, the projection 9A has a cylindrical shape whose top shape is like a circle. In a projection 9B shown in FIG. 34C, the projection 9B has a prismatic shape whose top shape is like a square. As shown in the top shapes of the projections 9, 9A, 9B, the top shape of the projection may be selected from a variety of shapes. Therefore, the top shape of the projection may be selected according to the shape of the contact face of the bump 5 and to the shape of the electrode part 38 formed on the fabrication board 10. In further detail, when the projections 9, 9A, 9B are formed by the etching method, by selecting the shape of the mask 13 arranged in the projection forming position 14 shown in FIG. 6, the top shapes of the projection 9, 9A, 9B may be selected to a desired shape.

Figure 35A:
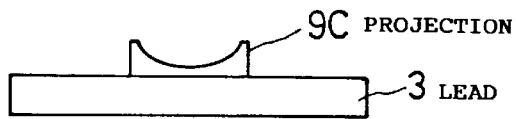
FIG. 35A to FIG. 35D show modifications of the projection, whose cross-sectional shapes are different.
Figure 35B:
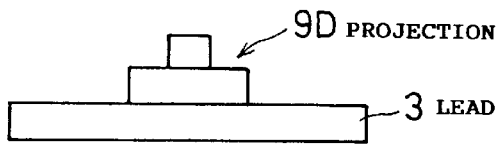
Figure 35C:
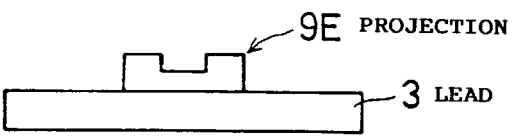

As shown in FIG. 35A, a projection 9C may have a curved concave shape in the upper side. As shown in FIG. 35B, a projection 9D may have another projection on the center of the top face. As shown in FIG. 35C, a projection 9E may have a concave part in the center of the top face. According to the projections 9C to 9E, an area of the surface of the projection may be increased, and, thus, the bump 5 may positively be connected to the projection. In the above-described projections 9C to 9E, each projection is fixed on the projection forming position of the lead 3 by using the conductive adhesive, etc.

Figure 35D:
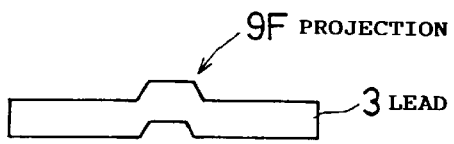

In FIG. 35D, a projection 9F is shown which is formed by plastically deforming the overall shape of the lead 3 by using a pressing process, etc. In this way, by using the plastic deformation process such as the pressing process, the projection 9F shown in FIG. 35D may easily be formed. However, a height of the projection 9F may not be increased more than a limit determined by the plastical deformation process.

Figure 36A:
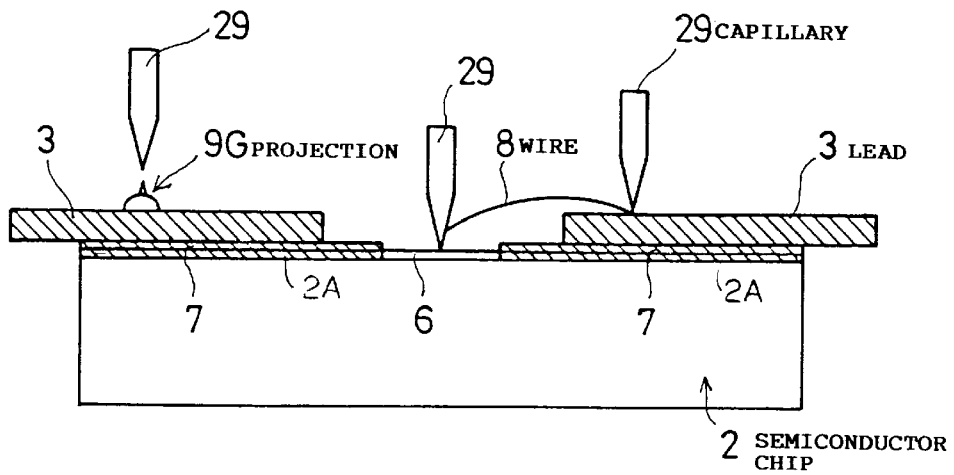
FIG. 36A and FIG. 36B show illustrations for explaining a method of forming the projection by a stud bump.
Figure 36B:
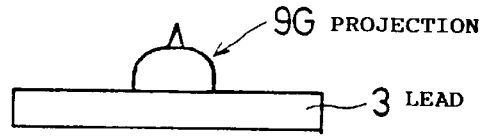

In FIG. 36A and FIG. 36B, by using the wire bonding technology, a stud bump is formed on the projection forming position to form a projection 9G. FIG. 36A shows a method of forming the projection 9G, and FIG. 36B shows an expanded illustration of the projection 9G.

As mentioned above, by using the wire bonding technology, the projection 9G is formed with the stud bump. Therefore, the projection 9G may be formed on a desired position, and, thus, the external connection port may be set at the desired position. The projection 9G may simultaneously be formed when the wires 8 are arranged in the connecting process of the manufacturing process of the semiconductor device. Therefore, the manufacturing process may be simplified.

Figure 37A:
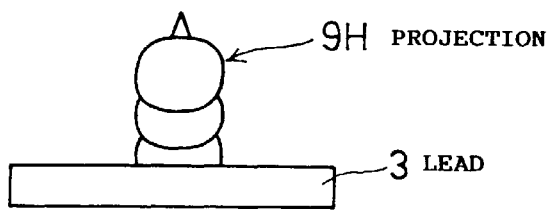
FIG. 37A to FIG. 37C show other projections formed by the stud bump.

A height of the projection 9G may flexibly be set by piling a plurality of stud bumps. As shown in FIG. 37A, a projection 9H is formed by piling three stud bumps, and a height of the projection 9H is larger than the height of the projection 9G shown in FIG. 36B which is formed by one stud bump.

Figure 37B:
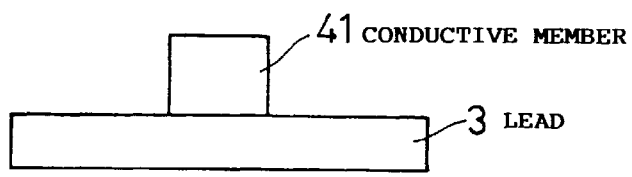
Figure 37C:
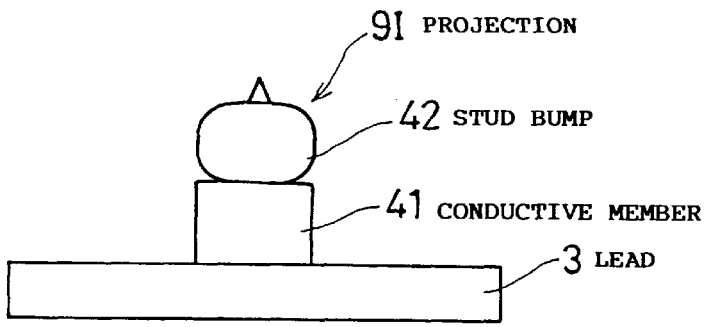

Another method of forming a high projection is shown in FIG. 37B and FIG. 37C. In the method, first, as shown in FIG. 37B, a block-shaped conductive member 41 is previously fixed on the lead 3 by the conductive adhesive, etc. After that, as shown in FIG. 37C, a stud bump 42 is formed on the conductive member 41, and the conductive member 41 and the stud bump 42 form as a projection 9I. In this configuration, a height of the projection 9I depends on a height of the conductive member 41. Since a variety of sizes of conductive members 41 are usable, the height of the projection 9I may be flexibly designed.

Figure 38:
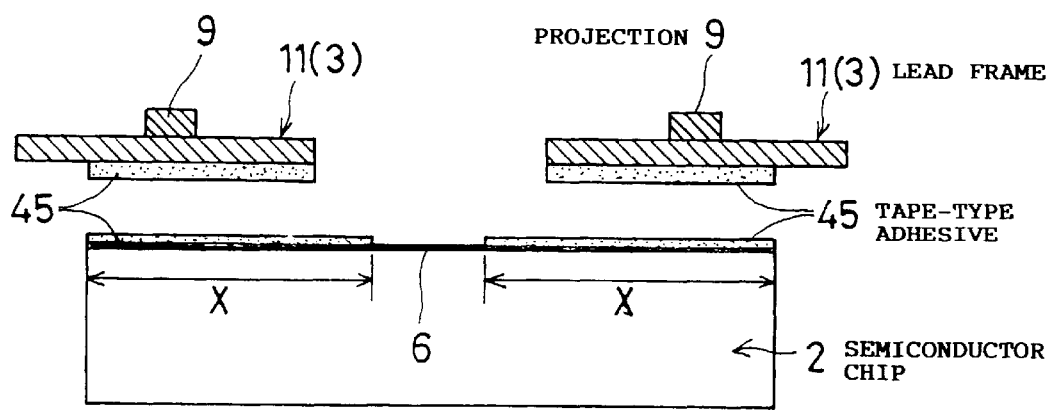
FIG. 38 shows an illustration for explaining a modification of the joining process.

FIG. 38 shows a modification of the joining process. In the previously mentioned embodiment shown in FIG. 16 to FIG. 20, the semiconductor chip 2 and the lead frame 11 are joined together by the polyimide film 7 being operated as an adhesive under the given conditions. In the modification shown in FIG. 38, the semiconductor chip 2 and the lead frame 11 may be joined together by using a tape-type adhesive 45 instead of the polyimide film 7.

As shown in FIG. 38, the tape-type adhesive 45 may be provided to a lower face of the lead frame 11 as well as an upper face of the semiconductor chip 2. In this case, it is possible to provide the tape-type adhesive 45 to only the lower face of the lead frame 11. Still further, the tape-type adhesive 45 may flexibly be provided to any area of a range represented by a symbol "X" except for the forming position of the electrode pad 6. In this case, the tape-type adhesive 45 needs to be an insulating adhesive to electrically insulating the lead frame 11 from the semiconductor chip 2.

FIG. 39 to FIG. 42 show modifications of the connecting process. In the previously-mentioned embodiment shown in FIG. 21 and FIG. 22, to connect the electrode pad 6 to the lead 3, the wire 8 is used. In the modifications shown in FIG. 39 to FIG. 42, a direct lead bonding method (DLB) which directly connects the electrode pad 6 and the lead 3 is used.

Figure 39:
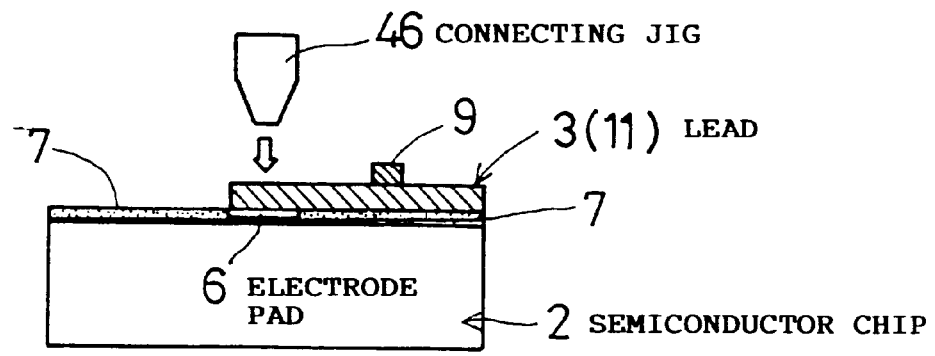
FIG. 39 shows an illustration for explaining a modification of the connecting process, and shows a method of directly connecting the lead to the electrode pad.
Figure 40:
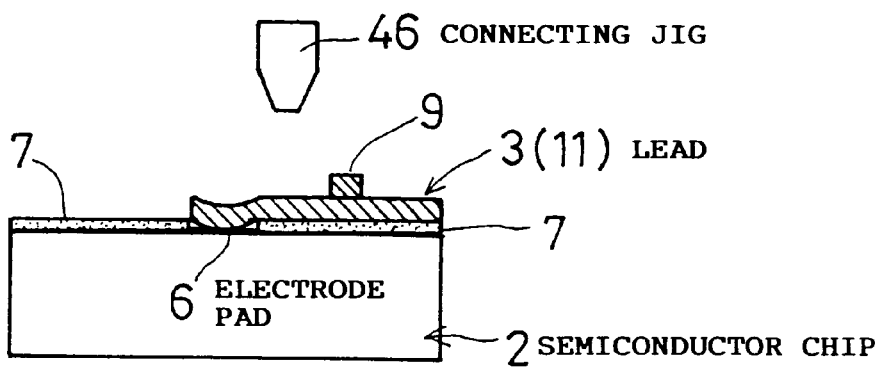
FIG. 40 shows an illustration for explaining the modification of the connecting process, and shows a case where the lead is directly connected to the electrode pad.

In the example shown in FIG. 39 and FIG. 40, the lead 3 is directly connected to the electrode pad 6 by using a connecting jig 46 connected to a supersonic vibrator, etc. However, in this configuration, by the connecting jig 46 being thus supersonically vibrated, the electrode pad 6 may be damaged.

Figure 41:
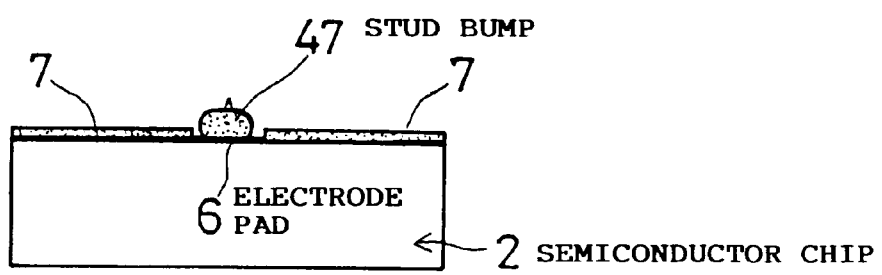
FIG. 41 shows an illustration for explaining another modification of the connecting process, and shows a method of connecting the lead to the electrode pad through the stud bump.
Figure 42:
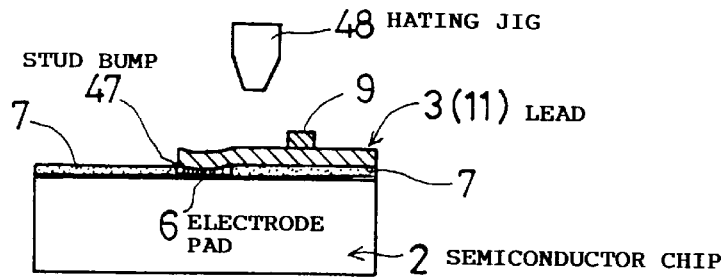
FIG. 42 shows an illustration for explaining the modification of the connecting process, and shows a case where the lead is connected to the electrode pad through the stud bump.

To resolve the problem, in the example shown in FIG. 41 and FIG. 42, a stud bump 47 is previously provided on the electrode pad 6. After the stud bump 47 contacts the lead 3, the stud bump 47 is heated and melted by using a heating jig 48 to connect the electrode pad 6 and the lead 3. In the connecting method, the electrode pad 6 is prevented from being damaged, and reliability of the connecting process may be improved.

In the connecting processes shown in FIG. 39 and FIG. 42, electrical resistance between the electrode pad 6 and the lead 3 may be reduced as compared to the configuration in which the electrode pad 6 and the lead 3 are connected through the wire 8. Therefore, electrical performance of the semiconductor device 1 may be improved and may be applicable for a high-speed semiconductor chip.

Figure 43:
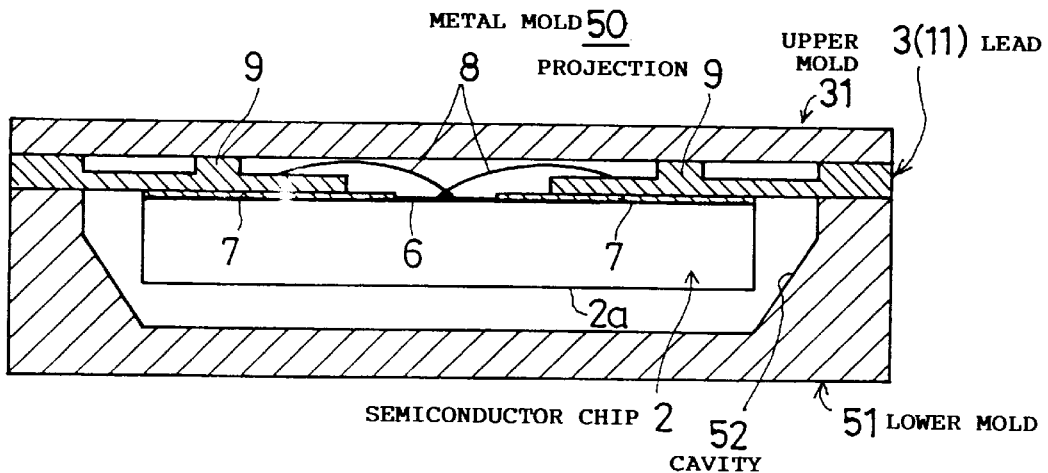
FIG. 43 shows an illustration for explaining a modification of the sealing-plastic providing process, and shows a case where the semiconductor chip is mounted to the metal mold.
Figure 44:
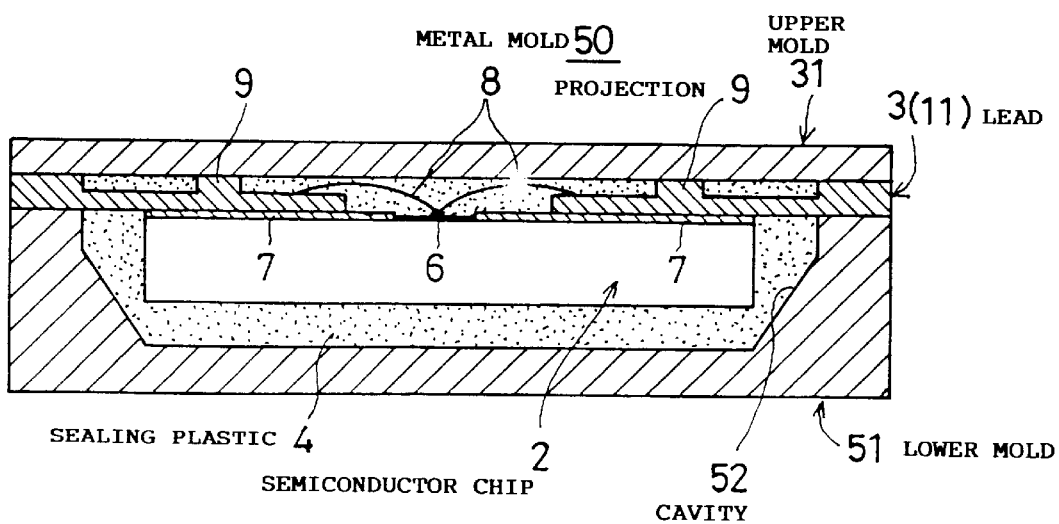
FIG. 44 shows an illustration for explaining the modification of the sealing-plastic providing process, and shows a case where the sealing plastic is provided to the metal mold.

FIG. 43 and FIG. 44 show modifications of the sealing-plastic providing process. In the previously-mentioned embodiment shown in FIG. 23 and FIG. 24, the bottom face of the cavity in the lower mold 32 of the metal mold 30 directly contacts the top face 2a of the semiconductor chip 2. As a result, the sealing plastic 4 is not provided on the top face 2a to improve heat radiating performance.

However, when an atmospheric condition of the semiconductor device 1 is severe (for example, a high humidity condition), improvement of wet-proof performance, for example, is more important than that of the heat-resistance performance. In such a condition, it is necessary to perfectly seal the semiconductor chip 2 with sealing plastic 4. A metal mold 50 shown in FIG. 43 or FIG. 44 may perfectly seal the semiconductor chip 2 with sealing plastic 4.

In further detail, as shown in FIG. 43, a cavity 52 is apart from the outside faces of the semiconductor chip 2. Therefore, as shown in FIG. 44, in a condition such that the sealing plastic 4 is provided to the metal mold, the semiconductor chip 2 is perfectly sealed within the sealing plastic 4. In this way, positions in the semiconductor chip 2 to which the sealing plastic 4 is provided may flexibly be set by changing the shape of the cavity 33, 52 of the metal mold 30, 50.

Figure 45:
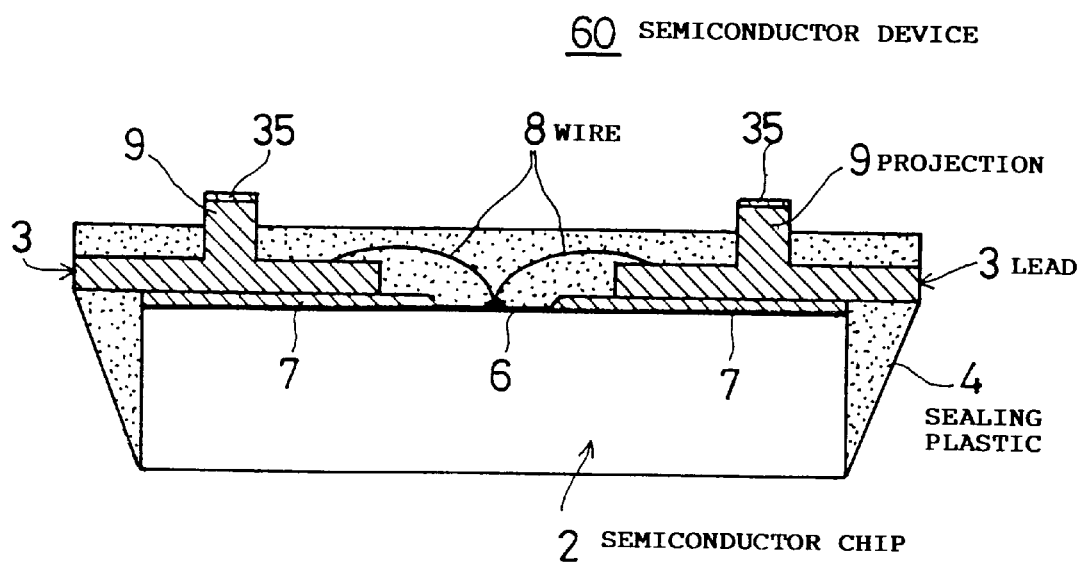
FIG. 45 shows a semiconductor device according to the present invention in which the projection is highly projected from the sealing plastic.

Further, when a concave part is formed in the upper mold 31 to mount the projection 9 formed in the lead 3, as shown in FIG. 45, it is possible to also form a semiconductor device 60 in which the projection 9 is highly exposed from the sealing plastic 45. In the semiconductor device 60, since the projection 9 is highly exposed from the sealing plastic 4, connecting performance of the semiconductor device 60 to the fabrication board 10 may be improved. Therefore, the semiconductor device 10 does not need to provide the bump 5 for the semiconductor device 1, and, thus, the manufacturing process of the semiconductor device 60 may be simplified.

In the modifications shown in FIG. 43 to FIG. 44, a direct lead bonding method (DLB) which directly connects the electrode pad 6 and the lead 3 is used.

Further, the present invention is not limited to these embodiments, but other variations and modifications may be made without departing from the scope of the present invention.

What is claimed is:

1. A semiconductor device comprising:

a semiconductor chip in which electrode pads are formed with a first pitch;

leads electrically connected with said electrode pads through lines, said pads being located beyond end portions of the leads, the end portions of the leads being wire-bonded to the pads; and sealing plastic sealing said semiconductor chip;

wherein projections used for external connection ports are formed in said leads with a second pitch, said projections and the sealing plastic being flush with each other, said projections being located at a side of a surface of the semiconductor chip on which circuits are formed within a chip area defined by said surface of the semiconductor chip;

said sealing plastic seals said lines connecting said electrode pads and said leads; and parts being provided at ends of the projections so as to protrude from said sealing plastic.

2. The semiconductor device as claimed in claim 1, wherein said semiconductor device further comprises a polyimide film operable as an adhesive and said semiconductor chip and said leads are joined by said polyimide film operating as the adhesive.

3. The semiconductor device as claimed in claim 2, wherein said projections are respectively formed as one body with said leads.

4. The semiconductor device as claimed in claim 3, wherein said lines comprise wires.

5. The semiconductor device as claimed in claim 4, wherein said semiconductor device further comprises bumps on said projections.

6. The semiconductor device as claimed in claim 1, wherein the top end part is exposed from a bottom face of the sealing plastic, and a part of the lead is exposed from a side face of said sealing plastic.

7. A semiconductor device comprising:

a semiconductor chip in which electrode pads are formed with a first pitch;

leads electrically connected with said electrode pads through lines, said pads being located beyond end portions of the leads, the end portions of the leads being wire-bonded to the pads; and sealing plastic sealing said semiconductor chip;

wherein projections used for external connection ports are formed in said leads with a second pitch, said projections and the sealing plastic being flush with each other, parts being provided at ends of said projections so as to protrude from said sealing plastic, said projections being located at a side of a surface of the semiconductor chip on which circuits are formed within a chip area defined by the surface of the semiconductor chip; and a thickness of said sealing plastic from a face of said electrode pads is equal to or smaller than a height of said projections from said face of the electrode pads, and is equal to or larger than a height from said face of the electrode pads to said lines.

8. The semiconductor device as claimed in claim 7, wherein the top end part is exposed from a bottom face of the sealing plastic, and a part of the lead is exposed from a side face of said sealing plastic.

9. The semiconductor device as claimed in claim 7, wherein said semiconductor device further comprises a polyimide film operable as an adhesive, and said semiconductor chip and said leads are joined by said polyimide film operating as the adhesive.

10. The semiconductor device as claimed in claim 9, wherein said projections are respectively formed as one body with said leads.

11. The semiconductor device as claimed in claim 10, wherein said lines comprise wires.

12. The semiconductor device as claimed in claim 11, wherein said semiconductor device further comprises bumps on said projections.

* * * * *